(12) United States Patent
Chen et al.

(10) Patent No.: US 11,469,139 B2
(45) Date of Patent: Oct. 11, 2022

(54) BOTTOM-UP FORMATION OF CONTACT PLUGS

(71) Applicant: Taiwan Semiconductor Manufacturing Company, Ltd., Hsinchu (TW)

(72) Inventors: Yen-Yu Chen, Taichung (TW); Chung-Liang Cheng, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/738,337

(22) Filed: Jan. 9, 2020

(65) Prior Publication Data
US 2021/0090948 A1 Mar. 25, 2021

Related U.S. Application Data

(60) Provisional application No. 62/903,424, filed on Sep. 20, 2019.

(51) Int. Cl.
| | | |
|---|---|---|
| *H01L 21/768* | (2006.01) | |
| *H01L 21/225* | (2006.01) | |
| *H01L 29/40* | (2006.01) | |
| *H01L 29/417* | (2006.01) | |
| *H01L 29/45* | (2006.01) | |
| *H01L 21/311* | (2006.01) | |

(52) U.S. Cl.
CPC .... *H01L 21/76879* (2013.01); *H01L 21/2254* (2013.01); *H01L 21/76843* (2013.01); *H01L 21/76856* (2013.01); *H01L 21/76865* (2013.01); *H01L 21/76876* (2013.01); *H01L 21/76882* (2013.01); *H01L 29/401* (2013.01); *H01L 29/41791* (2013.01); *H01L 21/31122* (2013.01); *H01L 21/76831* (2013.01); *H01L 29/456* (2013.01)

(58) Field of Classification Search
None
See application file for complete search history.

(56) References Cited

U.S. PATENT DOCUMENTS

| | | | |
|---|---|---|---|
| 6,391,769 | B1 | 5/2002 | Lee et al. |
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |

(Continued)

FOREIGN PATENT DOCUMENTS

| | | | | |
|---|---|---|---|---|
| KR | 20000021388 | A | 4/2000 | |
| KR | 20170141552 | A | 12/2017 | |
| WO | WO2016/204771 | * | 12/2016 | ............. H01L 21/28 |

*Primary Examiner* — Alexander G Ghyka
(74) *Attorney, Agent, or Firm* — Slater Matsil, LLP

(57) ABSTRACT

A method includes etching a dielectric layer to form a trench in the dielectric layer, depositing a metal layer extending into the trench, performing a nitridation process on the metal layer to convert a portion of the metal layer into a metal nitride layer, performing an oxidation process on the metal nitride layer to form a metal oxynitride layer, removing the metal oxynitride layer, and filling a metallic material into the trench using a bottom-up deposition process to form a contact plug.

20 Claims, 26 Drawing Sheets

(56) References Cited

U.S. PATENT DOCUMENTS

| | | |
|---|---|---|
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,014,185 B1* | 7/2018 | Wu .................. H01L 21/02186 |
| 2006/0113520 A1* | 6/2006 | Yamamoto .......... H01L 45/1625 |
| | | 257/3 |
| 2016/0005649 A1 | 1/2016 | Haukka et al. |
| 2017/0033222 A1 | 2/2017 | Wu et al. |
| 2017/0365555 A1* | 12/2017 | Choi ................. H01L 21/76846 |
| 2018/0138123 A1 | 5/2018 | Liang et al. |

* cited by examiner

US 11,469,139 B2

BOTTOM-UP FORMATION OF CONTACT PLUGS

PRIORITY CLAIM AND CROSS-REFERENCE

This application claims the benefit of the U.S. Provisional Application No. 62/903,424, filed Sep. 20, 2019, and entitled "Bottom-up Formation of Contact Plugs," which application is hereby incorporated herein by reference.

BACKGROUND

In the manufacturing of integrated circuits, source/drain contact plugs are used for connecting to the source and drain regions and the gates of transistors. The source/drain contact plugs are typically connected to source/drain silicide regions, whose formation process includes forming contact openings in an inter-layer dielectric, depositing a metal layer extending into the contact openings, and then performing an anneal to react the metal layer with the silicon/germanium of the source/drain regions. The source/drain contact plugs are then formed in the remaining contact openings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
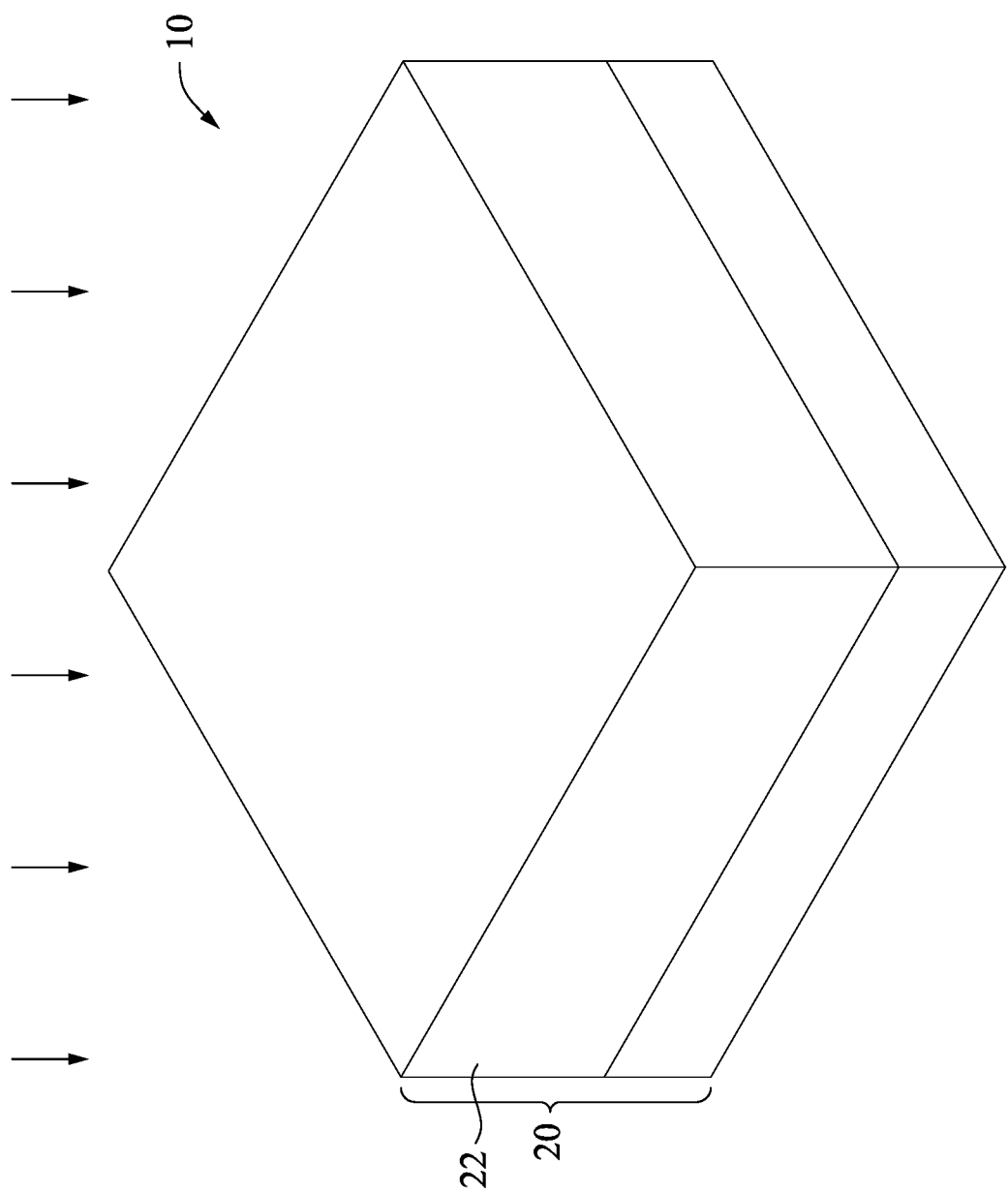
FIGS. 1-6, 7A, 7B, 8-11, 12A, 12B, and 13-22 illustrate the perspective views and cross-sectional views of intermediate stages in the formation of a transistor and the respective contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor and the method of forming the same are provided in accordance with some embodiments. The intermediate stages in the formation of the transistor and the corresponding contact plugs are illustrated in accordance with some embodiments. The intermediate stages of forming the transistors and the vias are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. Other types of transistors such as nanowire transistors, nano-sheet transistors, planar transistors, Gate-All-Around (GAA) transistors, and the like may also adopt the concept of the present disclosure. Furthermore, the method may be applied to other interconnect structures such as vias, metal lines, or the like. Although method embodiments may be discussed as being performed in a particular order, other method embodiments may be performed in any logical order.

In accordance with some embodiments of the present disclosure, a source/drain contact plug and a gate contact plug are formed over and contacting a source/drain region and a gate electrode, respectively, of a transistor. The formation processes of the contact plugs include depositing a metal layer, nitridating a surface portion of the metal layer to form a metal nitride layer, and performing an annealing process to form source/drain silicide. The metal nitride layer is then oxidized, so that the resulting oxide may be removed, and some portions of the metal nitride layer are left at the bottoms of the contact openings. The metal nitride layers are used as bases for selectively depositing a metal, and the deposition is bottom-up.

Figure 24:
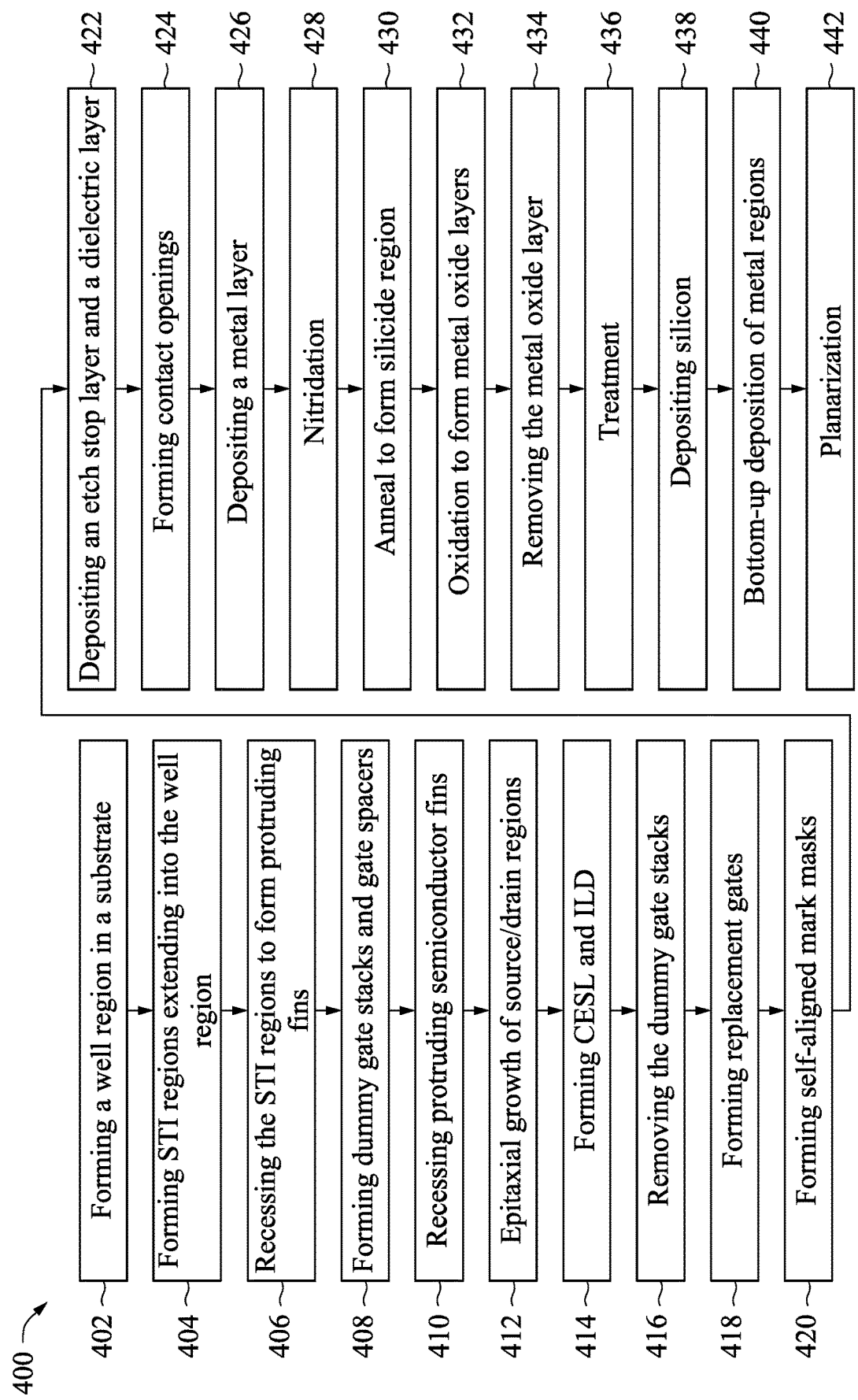
FIG. 24 illustrates a process flow for forming a transistor and the respective contact plugs in accordance with some embodiments.

FIGS. 1-6, 7A, 7B, 8-11, 12A, 12B, and 13-22 illustrate the perspective views and cross-sectional views of intermediate stages in the formation of a FinFET and the corresponding contact plugs in accordance with some embodiments of the present disclosure. The processes shown in these figures are also reflected schematically in the process flow 400 as shown in FIG. 24.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. Other substrates such as a multi-layered or gradient substrate may also be used. In some embodiments, the semiconductor material of semiconductor substrate 20 may include silicon; germanium; a compound semiconductor including silicon carbide, SiPC, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 shown in FIG. 24. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ is $cm^{-3}$, such as in the range between about $10^{17}$ $cm^{-3}$ and about $10^{18}$ is $cm^{-3}$.

Figure 2:
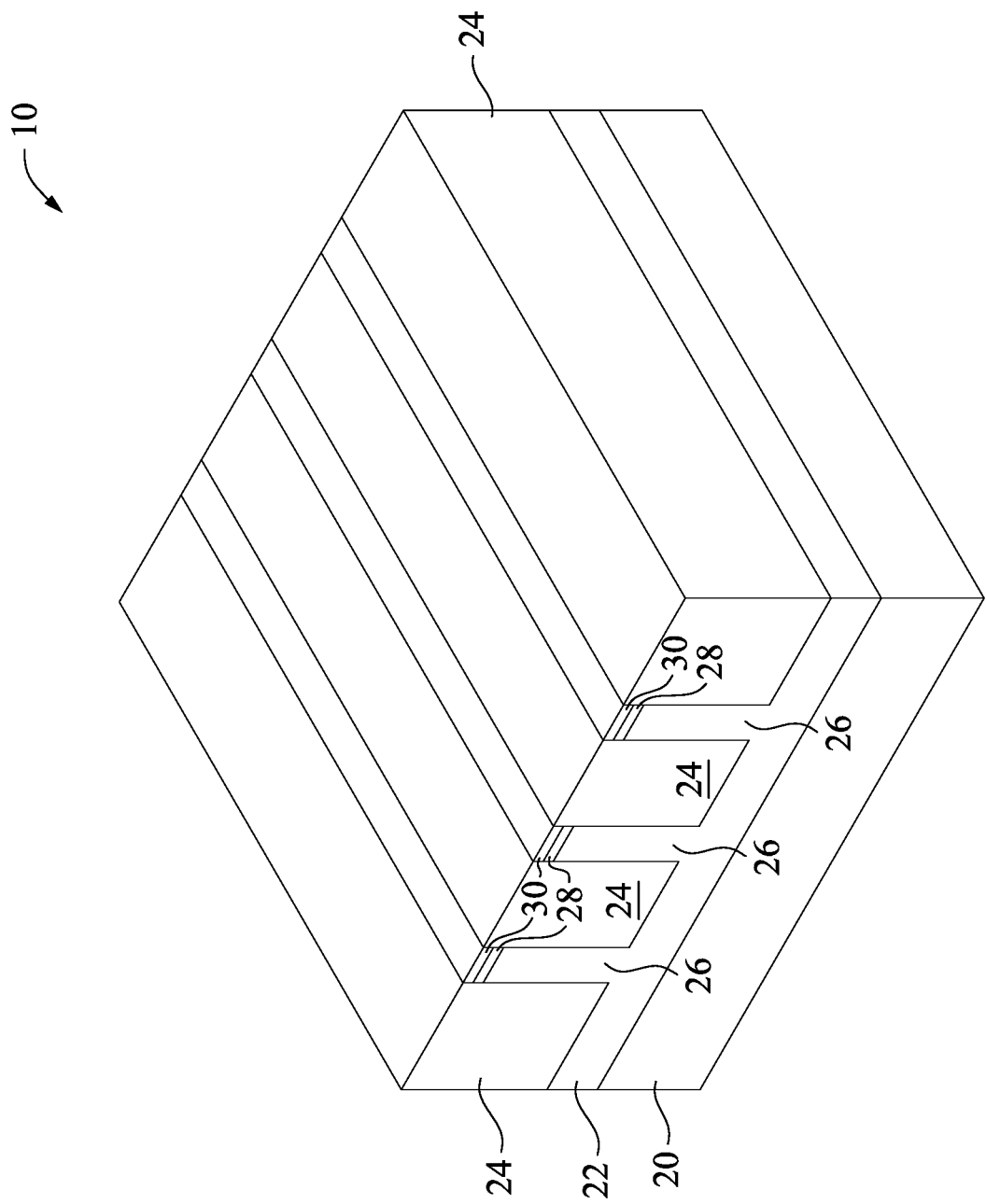

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 shown in FIG. 24. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
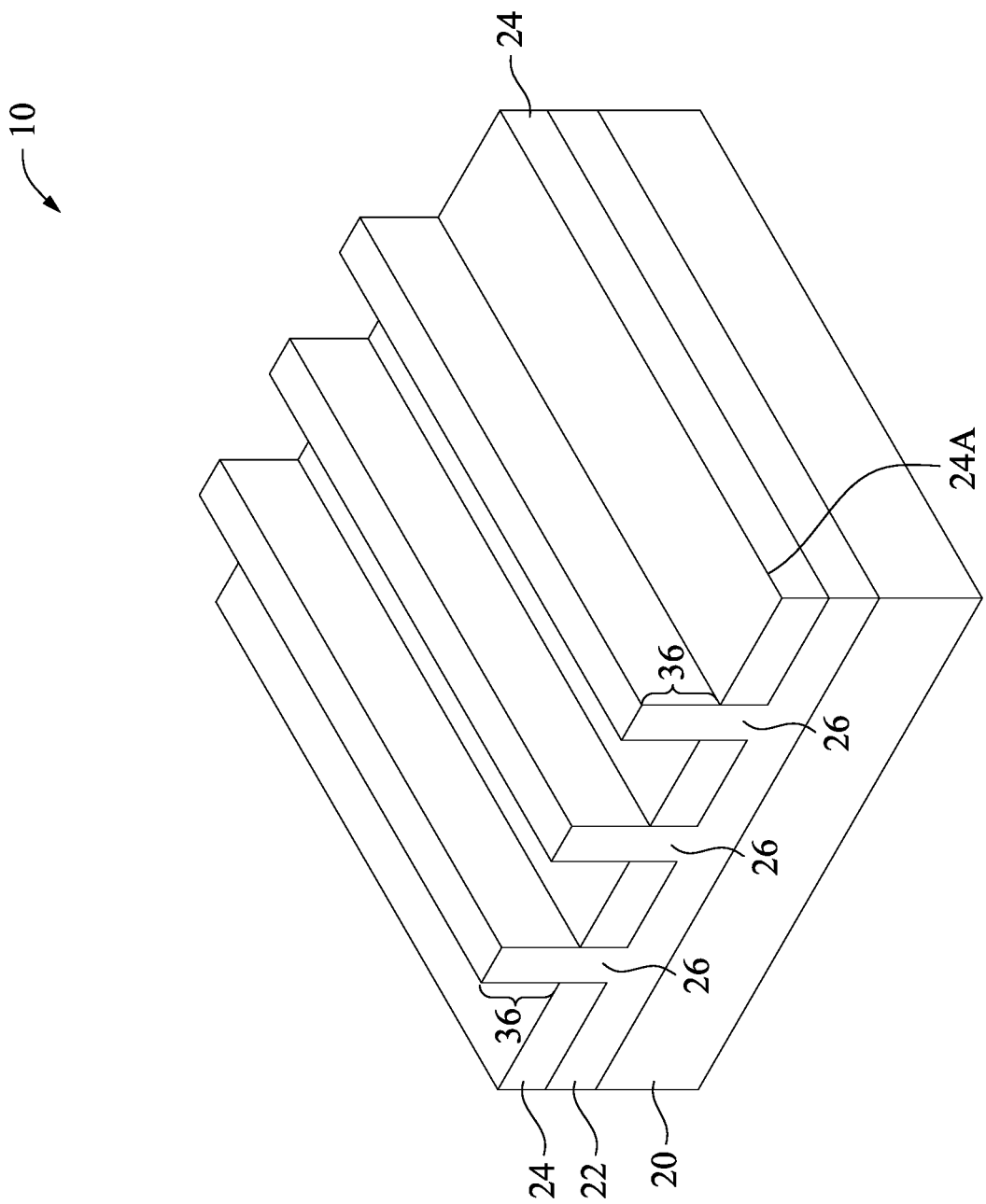

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 shown in FIG. 24. The etching may be performed using a dry etching process, wherein $HF_3$ and $NH_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

Protruding fins 36 may be formed of or replaced with other semiconductor materials. For example, for NMOS transistors, protruding fins 36 may be formed of or comprise Si, SiP, SiC, SiPC, or III-V compound semiconductor (such as InP, GaAs, AlAs, InAs, InAlAs, InGaAs, or the like). For PMOS transistors, protruding fins 36 may be formed of or comprise Si, SiGe, SiGeB, Ge or a III-V compound semiconductor (such as InSb, GaSb, InGaSb, or the like).

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
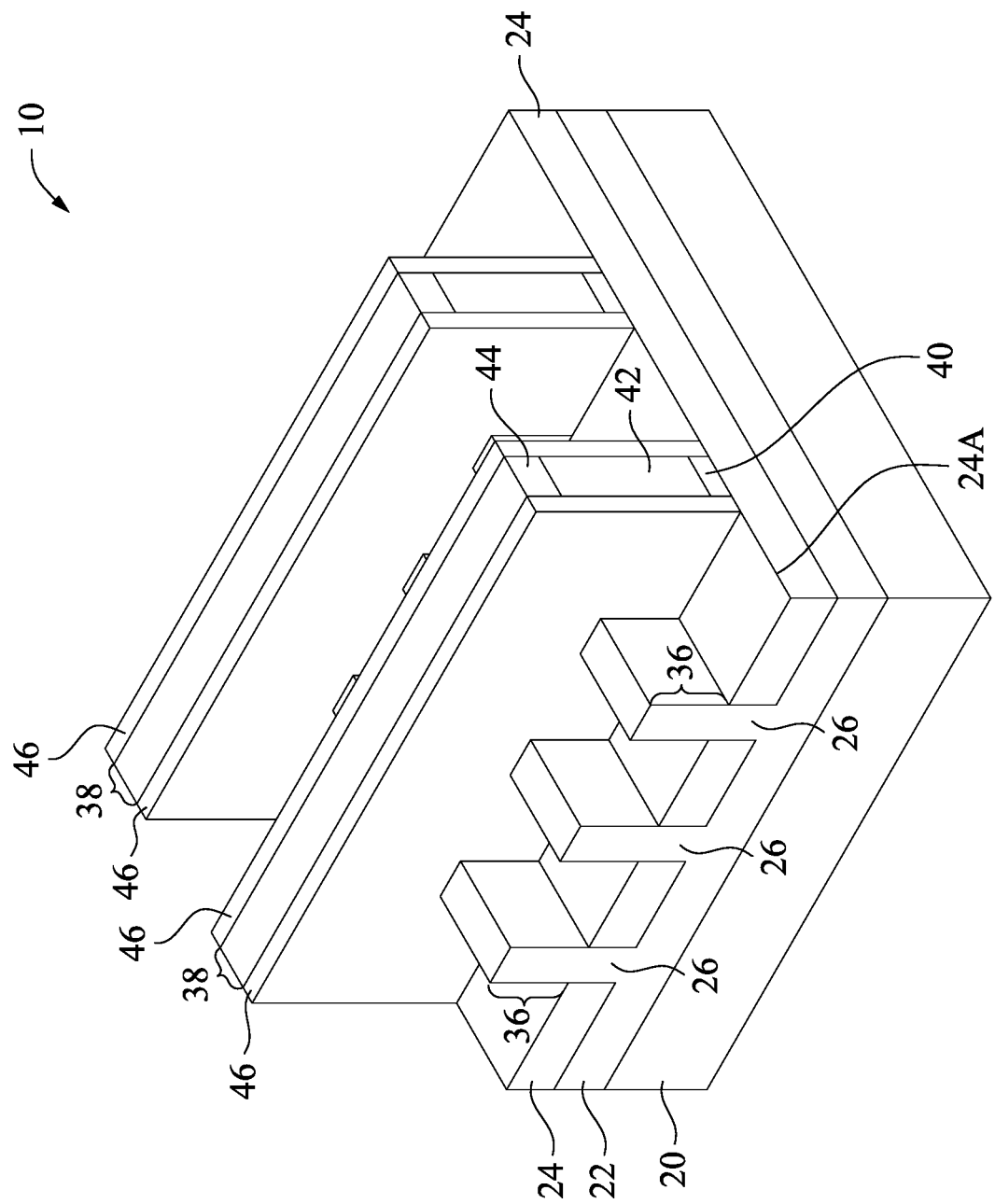

Referring to FIG. 4, dummy gate stacks 38 are formed to extend on the top surfaces and the sidewalls of (protruding) fins 36. The respective process is illustrated as process 408 in the process flow 400 shown in FIG. 24. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 shown in FIG. 24. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
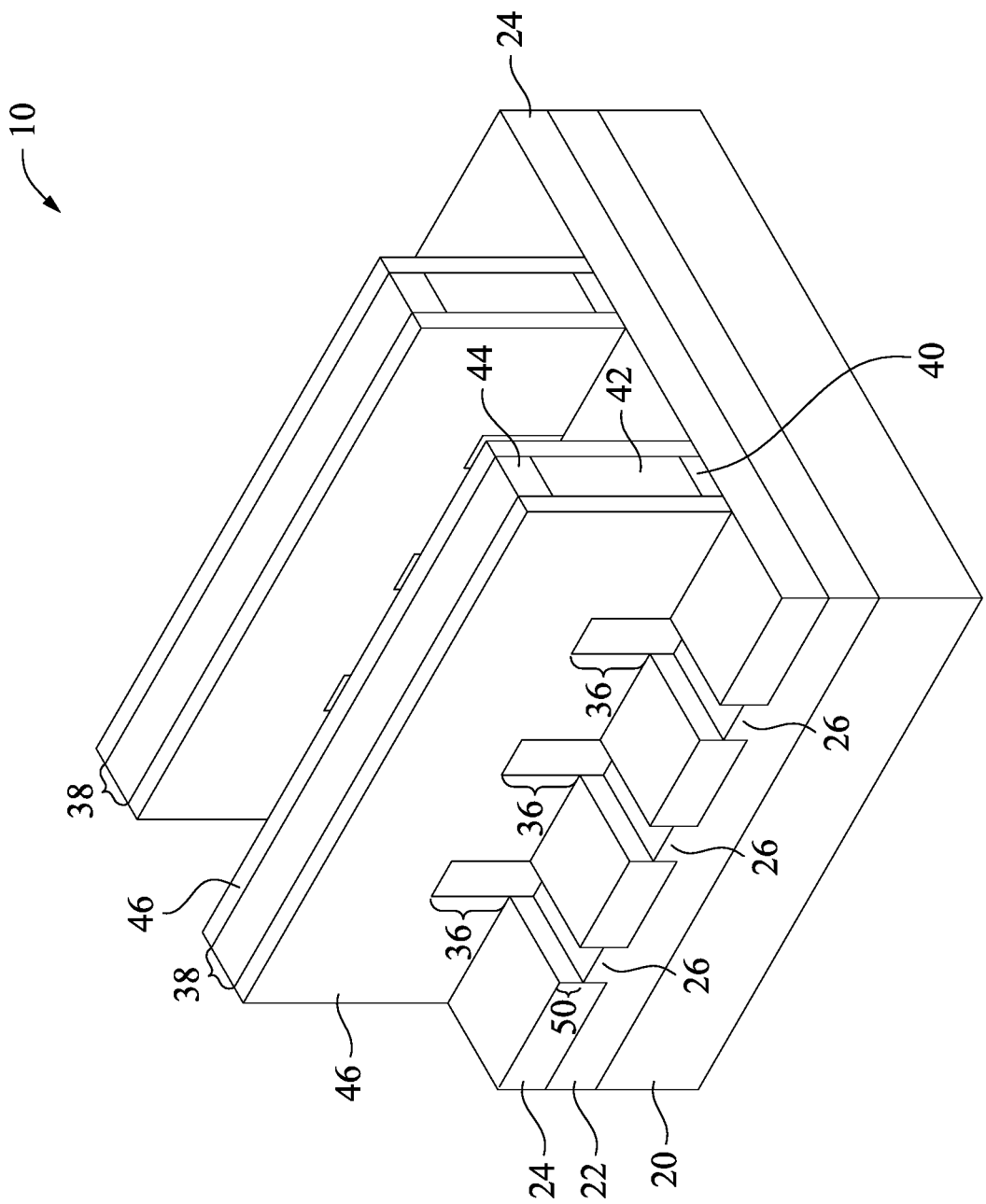

An etching process is then performed to etch the portions of protruding fins 36 that are not covered by dummy gate stacks 38 and gate spacers 46, resulting in the structure shown in FIG. 5. The respective process is illustrated as process 410 in the process flow 400 shown in FIG. 24. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
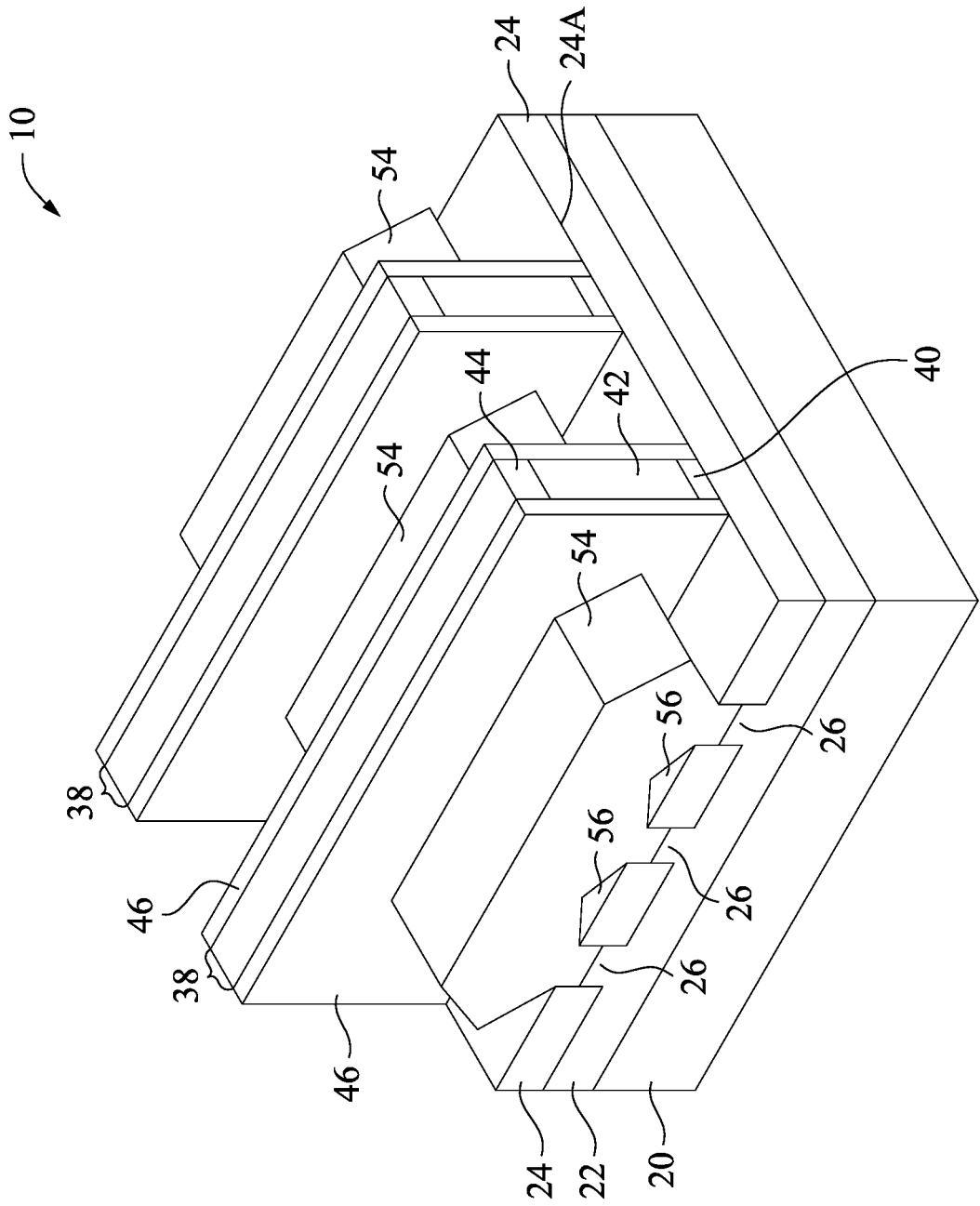

Next, epitaxy regions (source/drain regions) 54 are formed by selectively growing (through epitaxy) a semiconductor material in recesses 50, resulting in the structure in FIG. 6. The respective process is illustrated as process 412 in the process flow 400 shown in FIG. 24. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
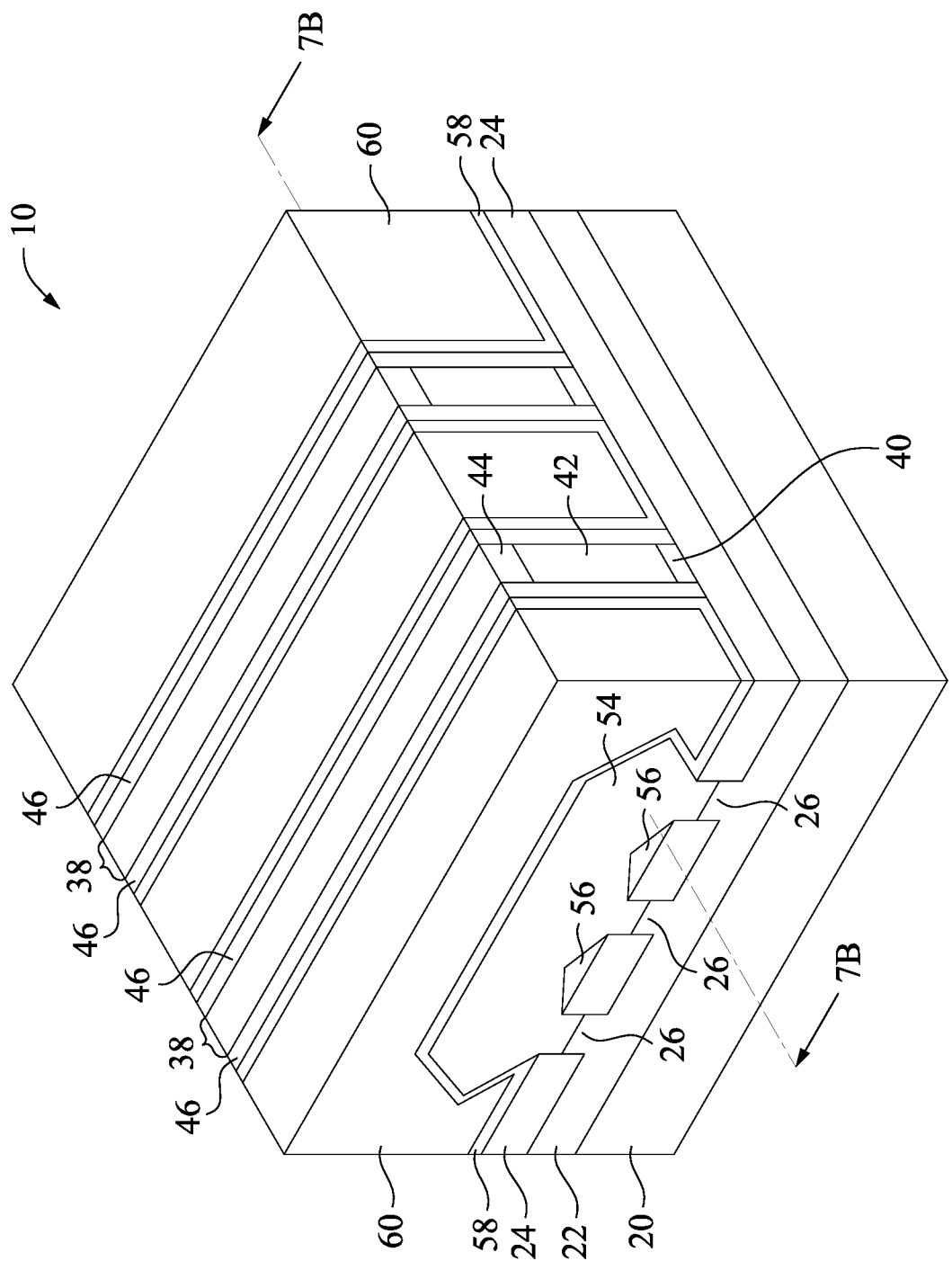

FIG. 7A illustrates a perspective view of the structure after the formation of Contact Etch Stop Layer (CESL) 58 and Inter-Layer Dielectric (ILD) 60. The respective process is illustrated as process 414 in the process flow 400 shown in FIG. 24. CESL 58 may be formed of silicon oxide, silicon nitride, silicon carbo-nitride, silicon oxy-carbide, silicon oxy-nitride, silicon oxy-carbo-nitride, aluminum oxide, aluminum nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), silicon oxy-carbide, a high-k dielectric material such as zirconium oxide, hafnium oxide, or a low-k dielectric material. A planarization process such as a CMP process or a mechanical grinding process may be performed to level the top surfaces of ILD 60, dummy gate stacks 38, and gate spacers 46 with each other.

Figure 7B:
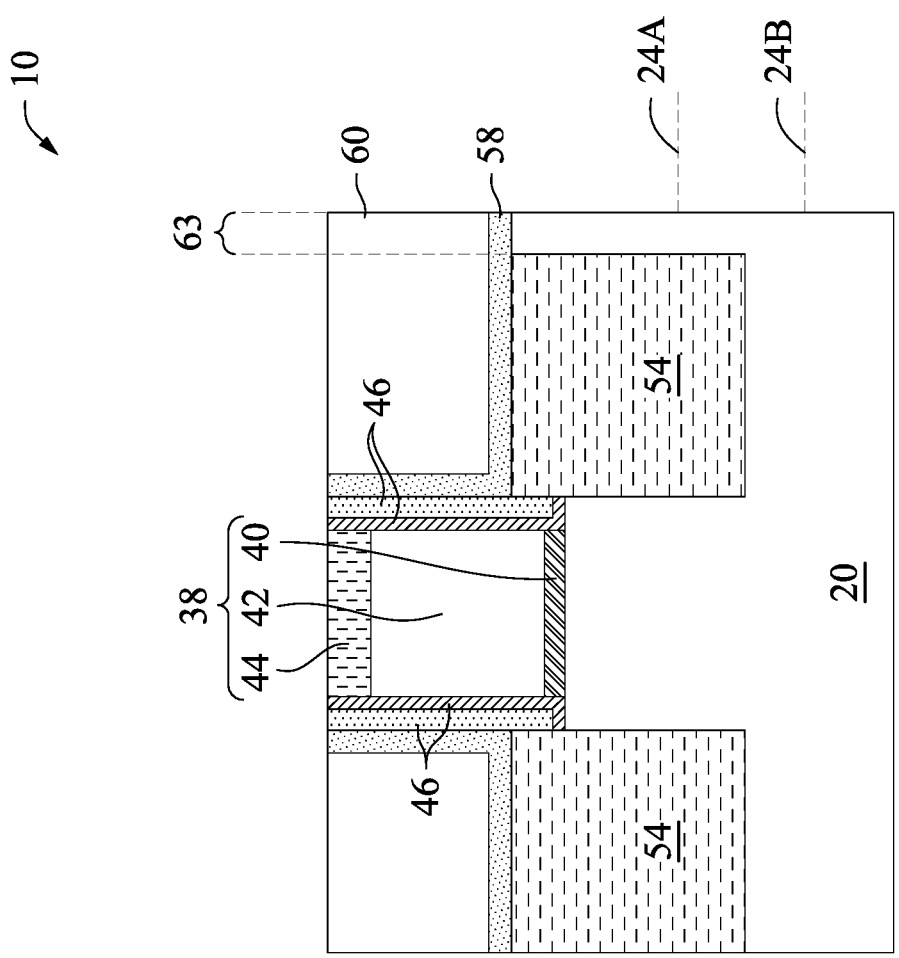

FIG. 7B illustrates the reference cross-section 7B-7B in FIG. 7A, in which dummy gate stacks 38 are illustrated. It is appreciated that the structures on the right side of source/drain region 54 (such as in regions 63) are not shown, while in some embodiments, a structure including a gate structure same as the gate structure 38 and the corresponding gate spacers may be formed in region 63 and the region on the right of region 63. The levels of top surface 24A and bottom surface 24B of STI regions 24 are shown to indicate the level of STI regions 24.

Figure 8:
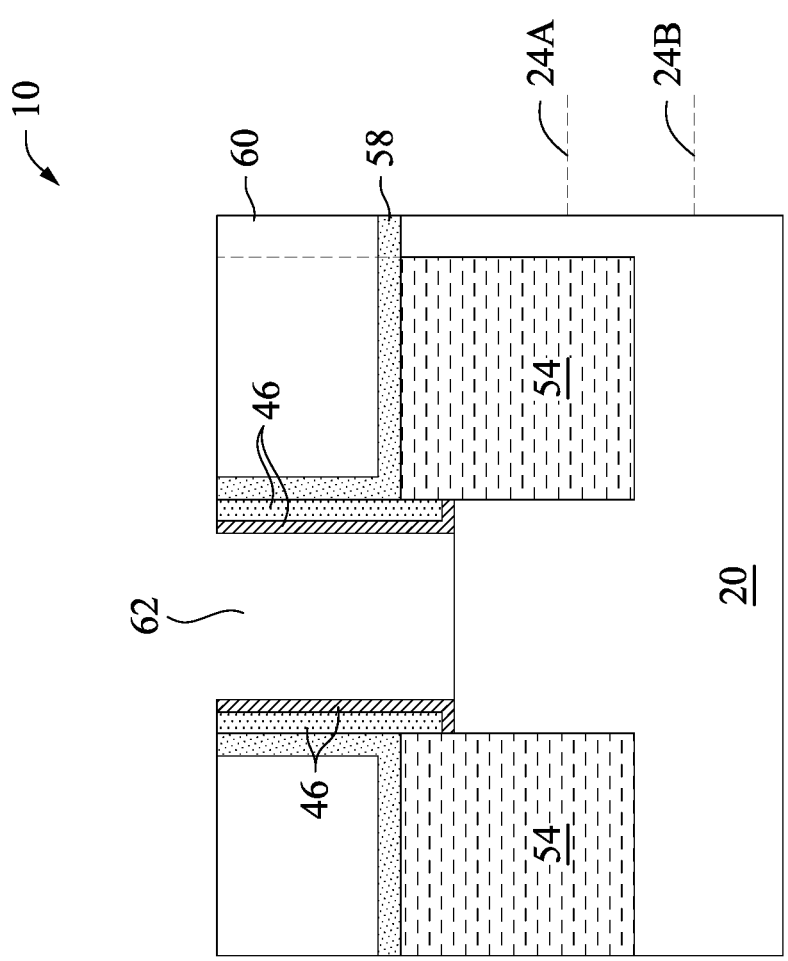
Figure 9:
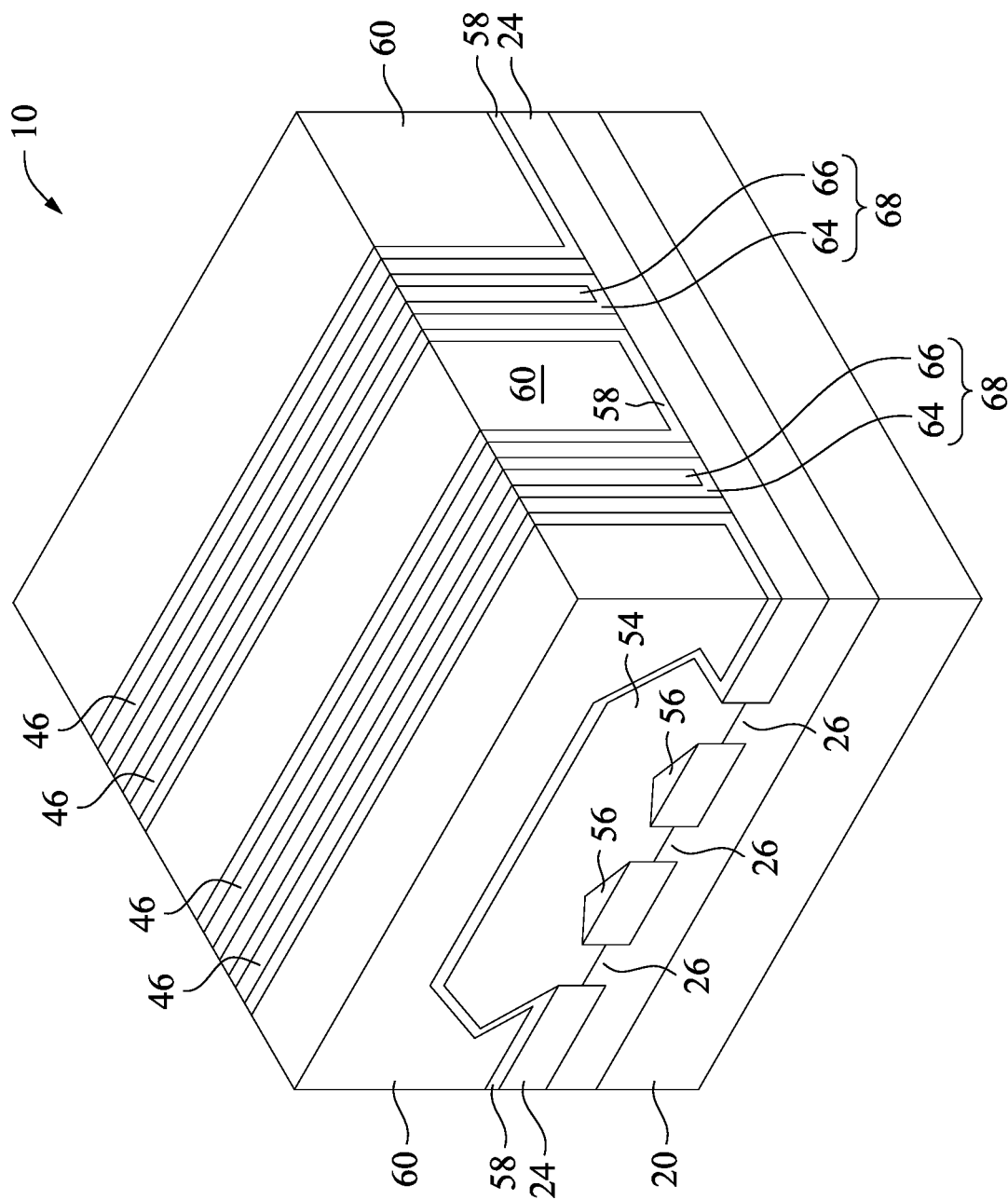

Next, the dummy gate stacks 38 including hard mask layers 44, dummy gate electrodes 42 and dummy gate dielectrics 40 are etched, forming trench 62 between gate spacers 46, as shown in FIG. 8. The respective process is illustrated as process 416 in the process flow 400 shown in FIG. 24. The top surfaces and the sidewalls of protruding fins 36 are exposed to trenches 62. Next, as shown in FIG. 9, replacement gate stacks 68 are formed in trenches 62 (FIG. 8). The respective process is illustrated as process 418 in the process flow 400 shown in FIG. 24. Replacement gate stacks 68 include gate dielectrics 64 and the corresponding gate electrodes 66.

In accordance with some embodiments of the present disclosure, the gate dielectric 64 includes an Interfacial Layer (IL) as its lower part. The IL is formed on the exposed surfaces of protruding fins 36. The IL may include an oxide layer such as a silicon oxide layer, which is formed through the thermal oxidation of protruding fins 36, a chemical oxidation process, or a deposition process. Gate dielectric 64 may also include a high-k dielectric layer formed over the IL. The high-k dielectric layer includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. The high-k dielectric layer is overlying, and may contact, the IL. In accordance with some embodiments of the present disclosure, the high-k dielectric layer is formed using ALD, CVD, PECVD, Molecular-Beam Deposition (MBD), or the like.

Gate electrode 66 is formed on gate dielectric 64. Gate electrode 66 may include a plurality of stacked layers, which may be formed as conformal layers, and a filling-metal region filling the rest of the trenches 62 unfilled by the plurality of stacked layers. The stacked layers may include a barrier layer, a work function layer over the barrier layer, and one or a plurality of metal capping layers over the work function layer. The filling-metal region may be formed of tungsten, cobalt, or the like. In accordance with alternative embodiments, the barrier layer may not be formed, and the capping layers may fully full the trenches, and the filling-metal region is not formed.

Figure 10:
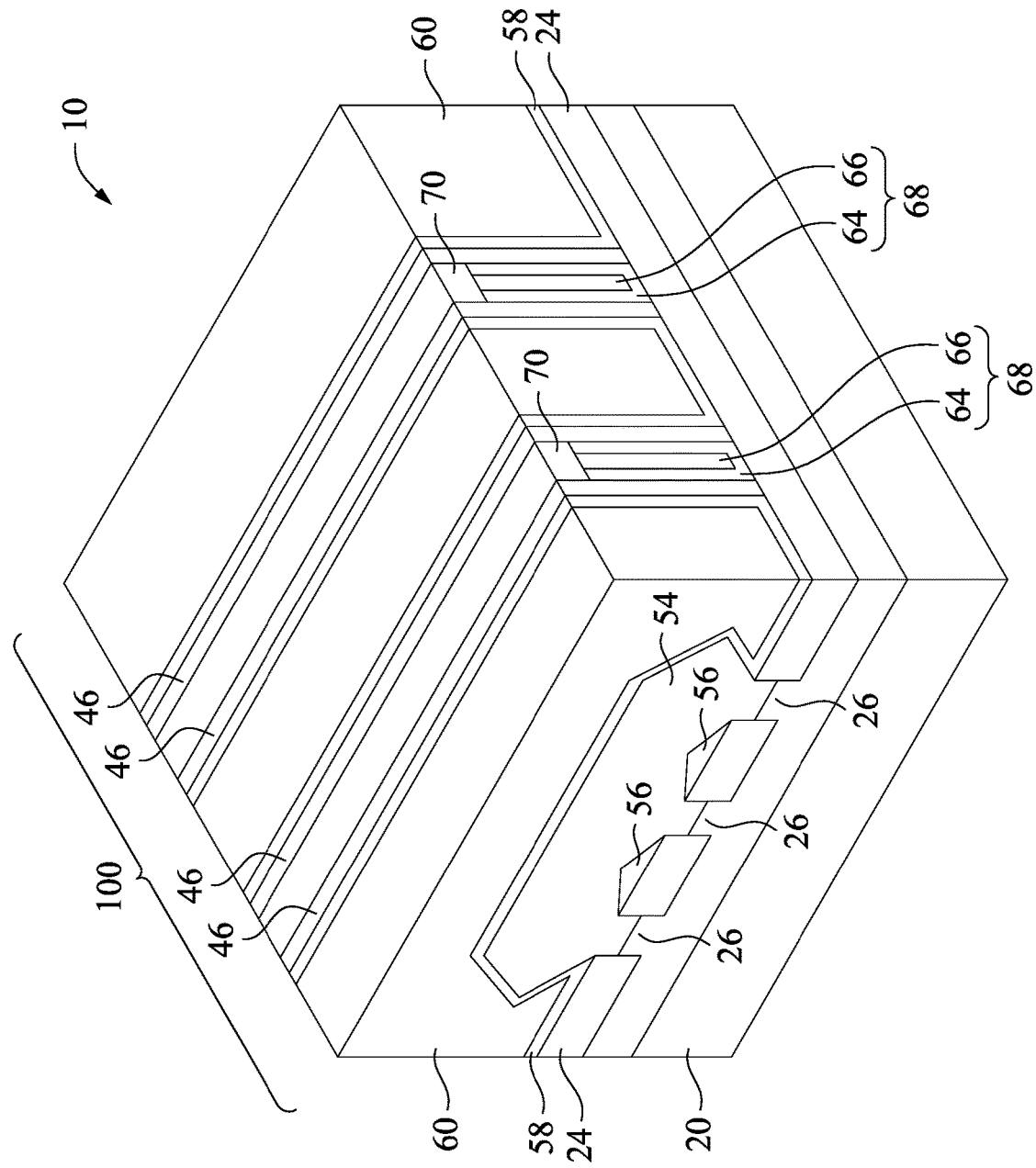
Figure 11:
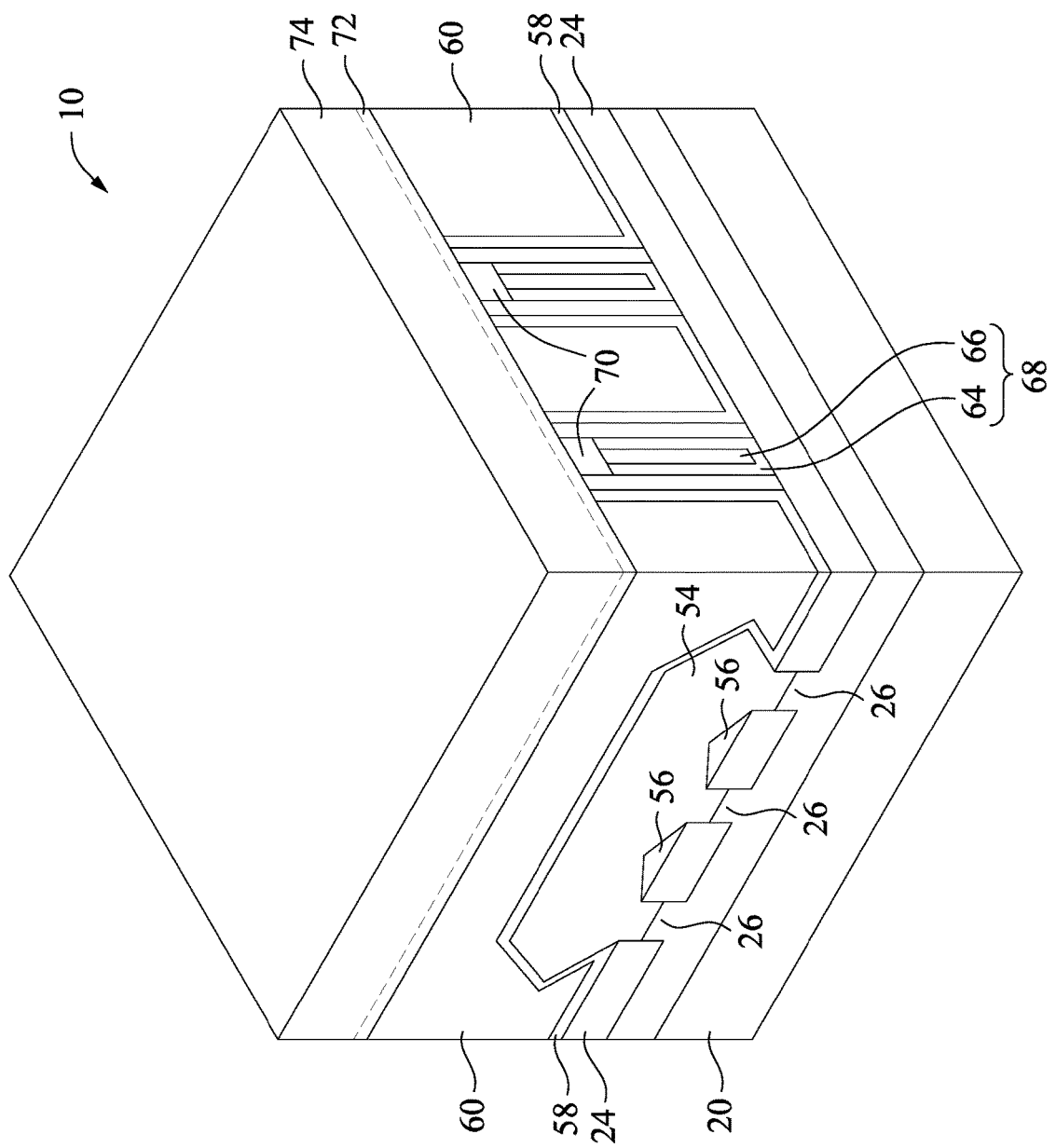

FIG. 10 illustrates the formation of self-aligned hard masks 70 in accordance with some embodiments. The respective process is illustrated as process 420 in the process flow 400 shown in FIG. 24. In accordance with other embodiments, the self-aligned hard masks 70 are not formed. The formation of hard masks 70 may include performing an etching process to recess gate stacks 68, so that recesses are formed between gate spacers 46, filling the recesses with a dielectric material, and then performing a planarization process such as a CMP process or a mechanical grinding process to remove excess portions of the dielectric material. Hard masks 70 may be formed of or comprise silicon nitride, silicon oxynitride, silicon oxy-carbo-nitride, or the like. FinFET 100 is thus formed.

Referring to Figure ii, etch stop layer 72 is formed. In accordance with some embodiments of the present disclosure, etch stop layer 72 is formed of a dielectric material, which may include silicon nitride, silicon oxy-carbide, silicon oxynitride, aluminum oxide, or the like, or multi-layers thereof. ILD 74 is deposited over etch stop layer 72. The processes for forming etch stop layer 72 and ILD 74 are illustrated as process 422 in the process flow 400 shown in FIG. 24. In accordance with some embodiments, ILD 74 is formed of a material selected from the same group of candidate materials for forming CESL 58.

Figure 12A:
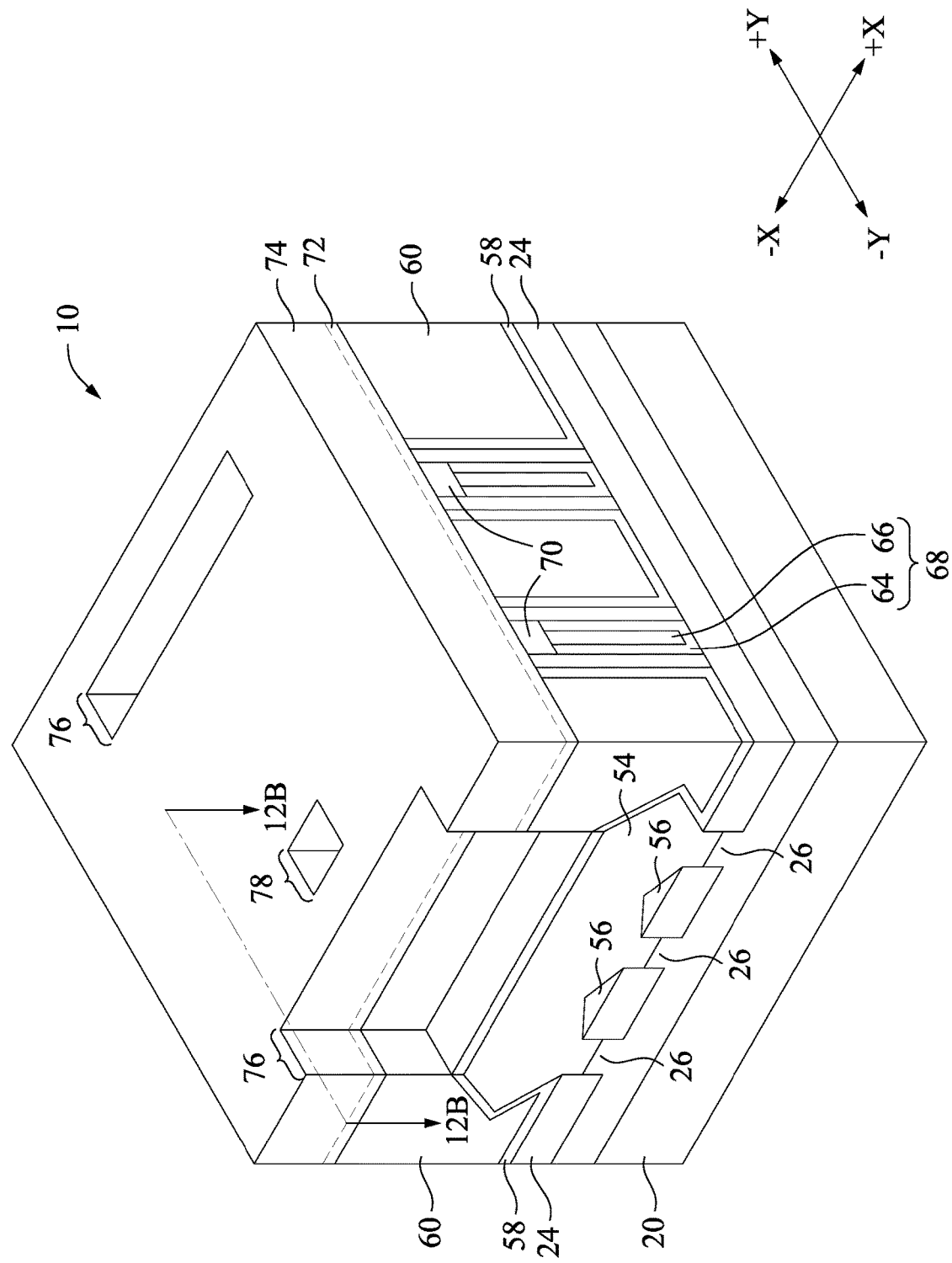
Figure 12B:
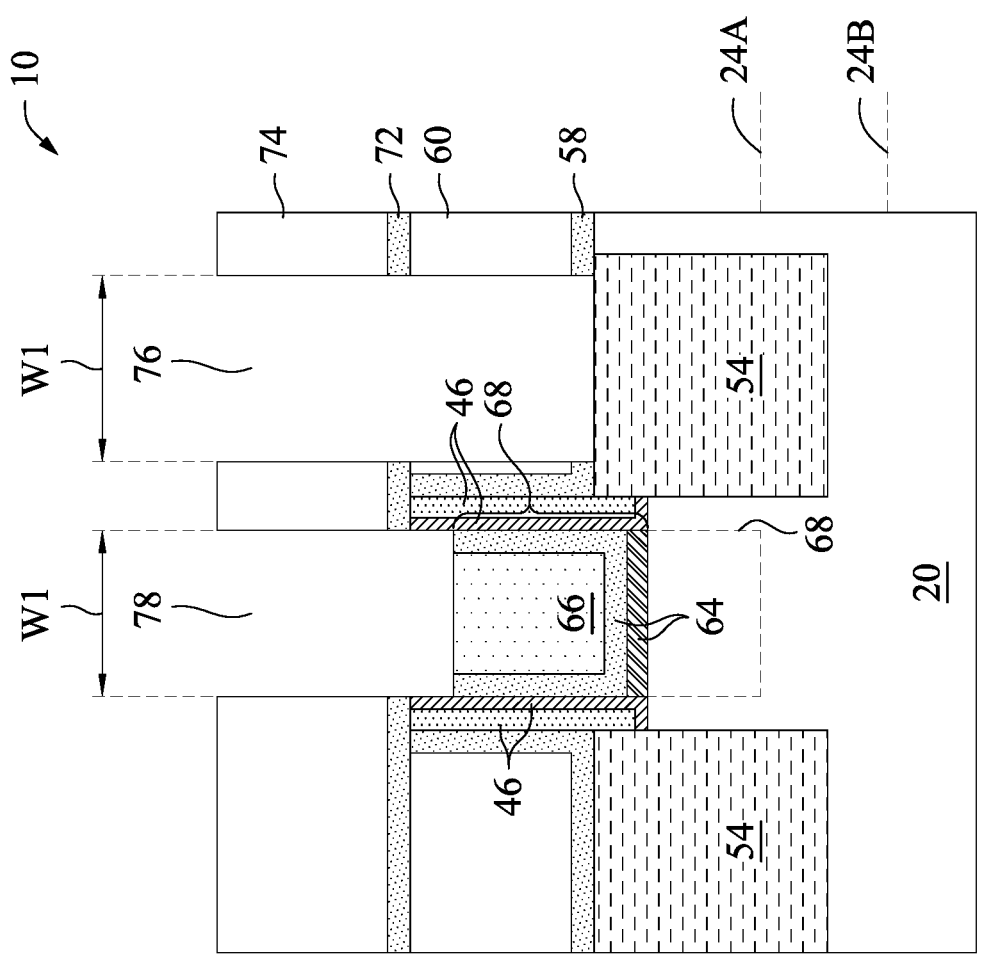

FIGS. 12A and 12B illustrate the formation of source/drain contact opening 76 and gate contact opening 78. The respective process is illustrated as process 424 in the process flow 400 shown in FIG. 24. The formation process of source/drain contact opening 76 may include forming a patterned photo resist (not shown), and etching ILD 74, etch stop layer 72, ILD 60, and CESL 58 to reveal source/drain region 54. The formation process of gate contact opening 78 may include forming another patterned photo resist (not shown), and etching ILD 74, etch stop layer 72, and hard mask 70 to reveal gate electrode 66. Source/drain contact opening 76 and gate contact opening 78 may be formed by different etching processes or may be formed using common etching processes. In accordance with some embodiments, source/drain contact opening 76 is elongated, and has a lengthwise direction (X-direction) perpendicular to the source-drain region direction (Y-direction). In accordance with some embodiments, ILDs 74 and 60 may be etched using the mixed gases of $NF_3$ and $NH_3$, the mixed gases of HF and $NH_3$, or the like. Etch stop layer 72 and CESL 58 may be etched using the mixed gases of $CF_4$, $O_2$, and $N_2$, the mixed gases of $NF_3$ and $O_2$, the mixed gases of $SF_6$ and $O_2$, or the like. After the contact openings 76 and 78 are formed, a clean process may be performed to remove the polymer generated in the etching process. The clean process may be performed using oxygen ($O_2$) or the mixture of $H_2$ and $N_2$, with plasma generated, followed by a wet clean process using de-ionized water.

FIG. 12B illustrates the reference cross-section 12B-12B in FIG. 12A. In accordance with some embodiments, the widths W1 of openings 76 and 78 are in the range between about 12 nm and about 20 nm. The aspect ratios (which are the ratios of depths to the respective widths) of openings 76 and 78 may be in the range between about 6 and about 8.

Figure 13:
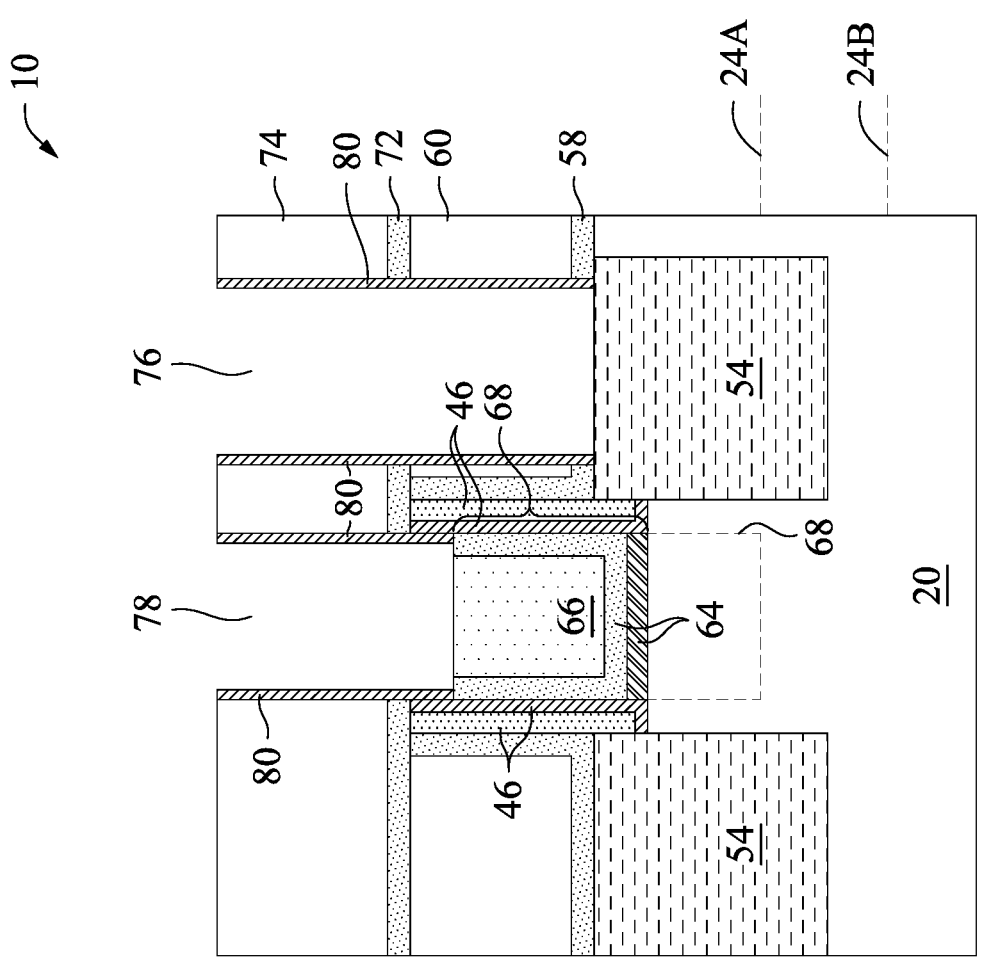

Next, referring to FIG. 13, dielectric spacers 80 are formed. The formation process may include depositing a blanket dielectric layer, and etching the blanket dielectric layer through an anisotropic etching process. The blanket dielectric layer may be a conformal or substantially conformal layer, for example, with the thicknesses of horizontal portions and vertical portions having a difference smaller than about 10 percent of the horizontal thickness. The deposition may be achieved through ALD, CVD, or the like. Dielectric spacers 80 may be formed of a dielectric material selected from SiN, SiON, SiCN, SiC, SiOCN, AlON, AlN, $HfO_x$, combinations thereof, and/or multi-layers thereof. Dielectric spacers 80 may help to prevent the leakage between the subsequently formed source/drain contact plug and gate contact plug. The thickness of dielectric spacers 80 may be in the range between about 1 nm and about 3 nm.

Figure 14:
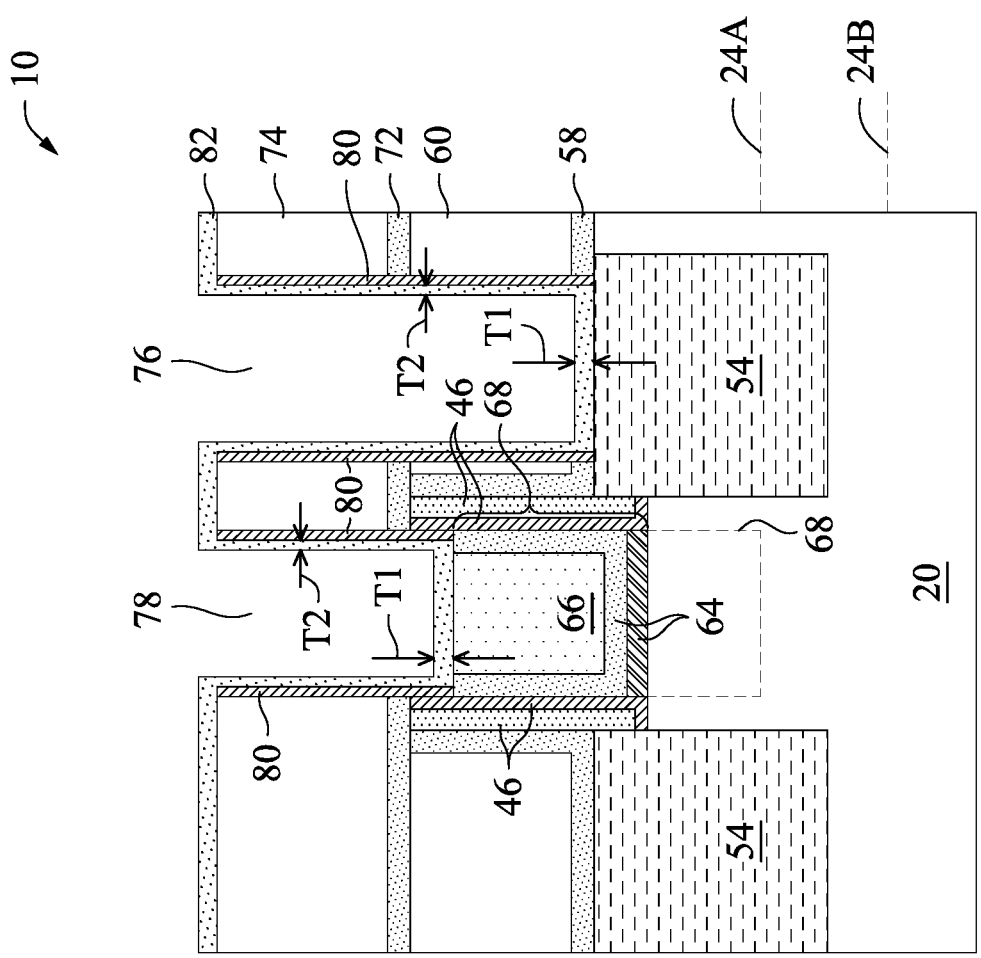

Referring to FIG. 14, metal layer 82 is deposited, which extends into both of source/drain contact opening 76 and gate contact opening 78. The respective process is illustrated as process 426 in the process flow 400 shown in FIG. 24. Metal layer 82 may be formed of or comprise pure or substantially pure (for example, over 95 percent) Ti, Ta, Ni, or the like, or alloys thereof. Metal layer 82 is a non-conformal layer, with thickness T1 of the horizontal portions being greater than thickness T2 of the vertical portions. Thickness T2 may be measured at the middle depths of openings 76 and 78. In accordance with some embodiments of the present disclosure, ratio T1/T2 is greater than 5:1, and may be in the range between about 5:1 and about 15:1. For example, thickness T1 may be in the range between about 100 Å and about 150 Å. Thickness T2 may be in the range between about 6 Å and about 20 Å. In accordance with some embodiments of the present disclosure, the deposition is performed through Physical Vapor Deposition (PVD). To achieve the desirable ratio T1/T2, the deposition may be performed with a bias power (and a bias voltage) applied. For example, the bias voltage may be greater than about 150 volts, and may be in the range between about 150 volts and about 300 volts.

Figure 15:
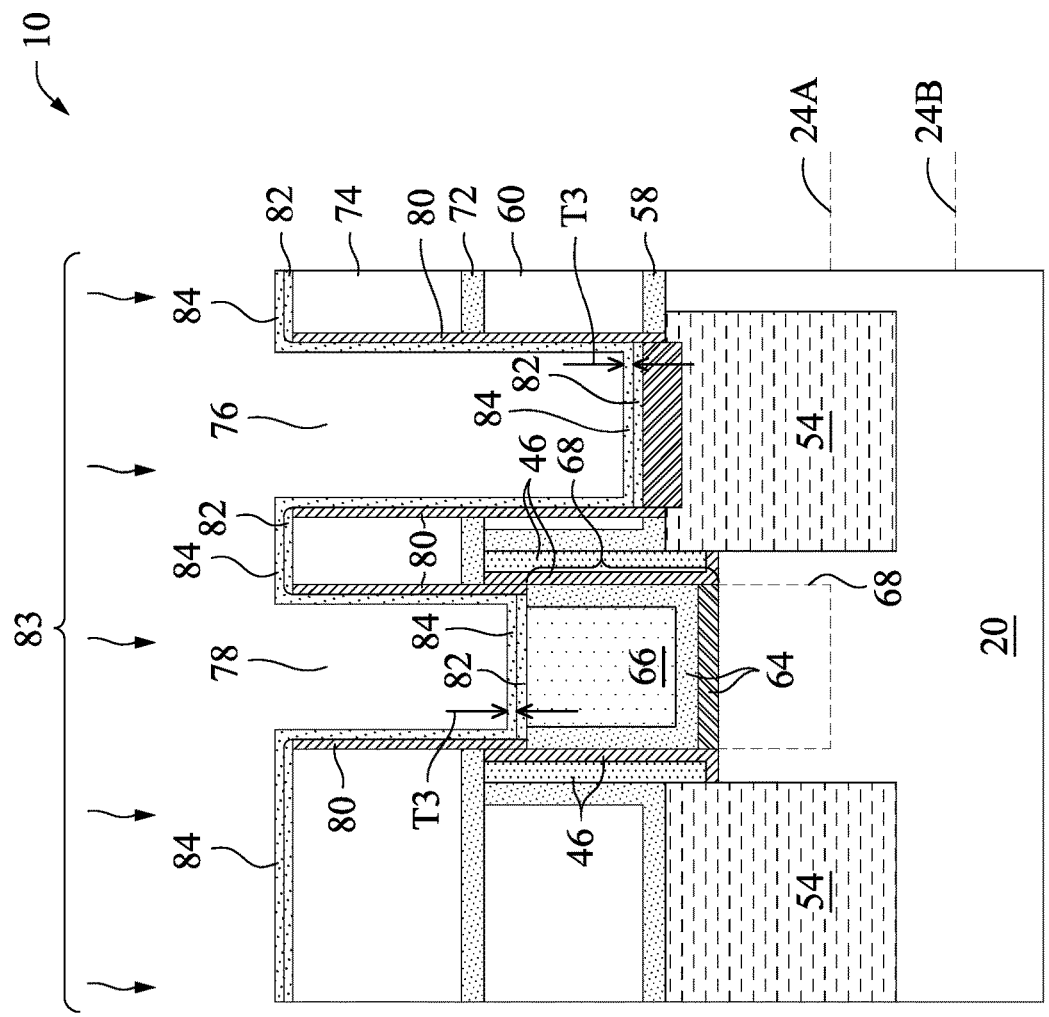

FIG. 15 illustrates a nitridation process 83 to form metal nitride layer 84. The respective process is illustrated as process 428 in the process flow 400 shown in FIG. 24. In accordance with some embodiments, the nitridation process is performed by treating metal layer 82 in a nitrogen-containing process gas such as ammonia ($NH_3$). Metal nitride layer 84 may be formed of or comprise TiN, TaN, NiN, or the like, or combinations thereof. The nitridation process may be performed through a thermal nitridation process and/or a plasma nitridation process. A surface layer of metal layer 82 is converted into metal nitride layer 84. The sidewall portions of metal layer 82 may be fully converted. Alternatively, a surface layer of each of the sidewall portions of metal layer 82 is converted, while an inner portion of the sidewall portions of metal layer 82 remains to be metal layer. The horizontal portions of metal nitride layer 84 are partially converted, with metal nitride layer 84 overlapping the remaining portions of metal layer 82. In accordance with alternative embodiments, instead of depositing and then nitridating a metal layer, metal nitride layer 84 is deposited over metal layer 82. In accordance with some embodiments, at the bottoms of source/drain contact opening 76 and gate contact opening 78, the thicknesses T3 of metal nitride layer 84 may be in the range between about 4 nm and about 6 nm.

Figure 16:
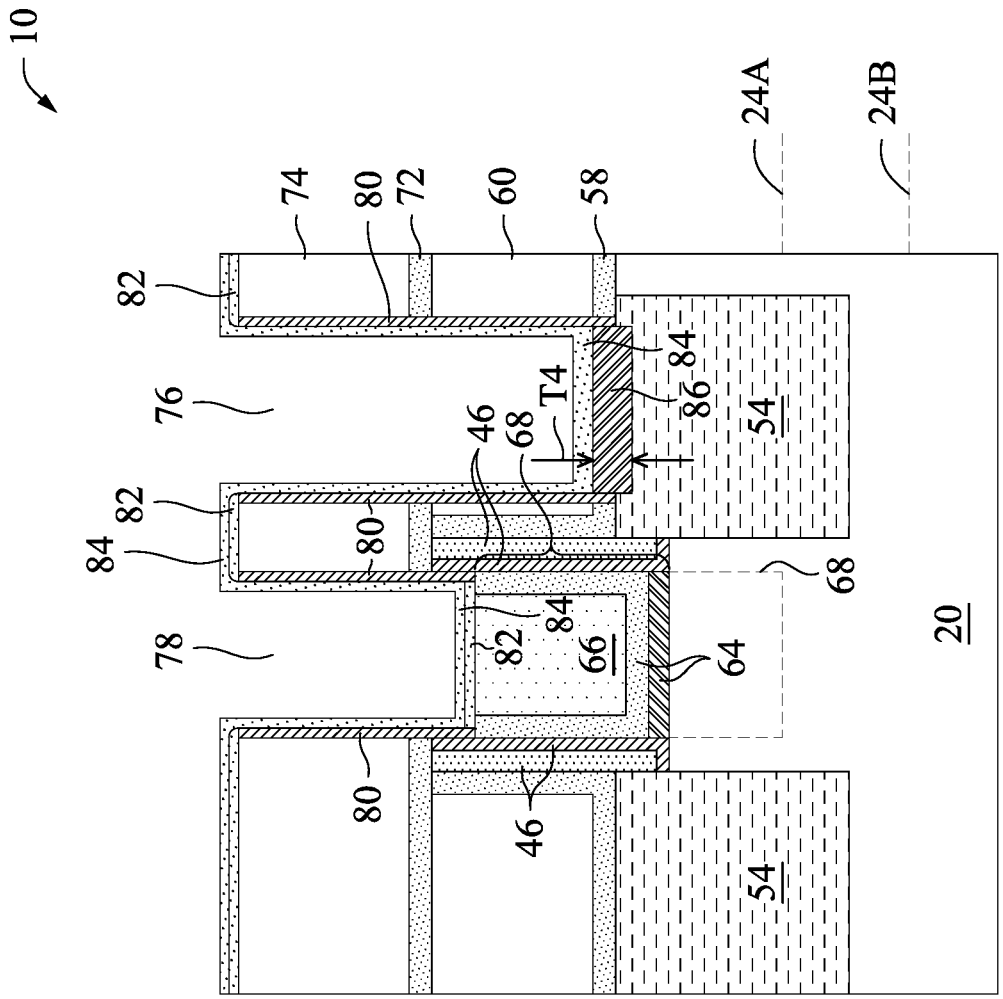

FIG. 16 illustrates the silicidation process through annealing, so that metal layer 82 reacts with source/drain region 54 to form silicide region 86, which comprises titanium silicide, tantalum silicide, nickel silicide, or the like, depending on the metal in metal layer 82. The respective process is illustrated as process 430 in the process flow 400 shown in FIG. 24. The thickness T4 of silicide region 86 may be in the range between about 4 nm and about 6 nm. The silicidation process may be performed by annealing wafer 10 at a temperature in the range between about 500° C. and about 600° C., for example, for a period of time in the range between about 10 seconds and about 20 seconds. As a result of the silicidation process, the portions of metal layer 82 at the bottom of source/drain contact opening 76 is fully silicided, and hence metal nitride layer 84 contacts silicide region 86. On top of gate electrode 66, metal layer 82 may still have a portion remaining under the respective part of metal nitride layer 84.

Figure 17:
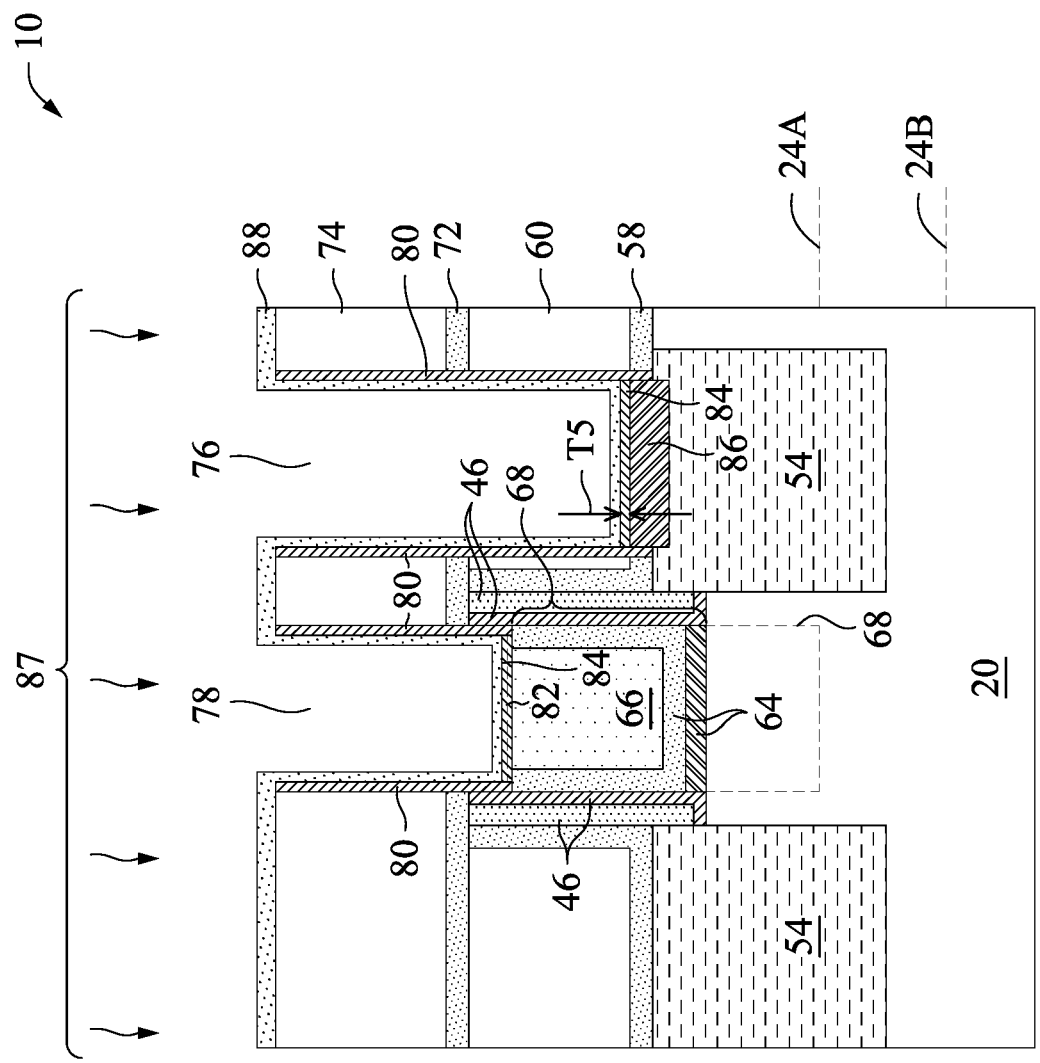

Referring to FIG. 17, an oxidation process 87 is performed to form metal oxide layer 88, which may be formed of or comprise TiOx, TaOx, NiOx, or combinations thereof. The respective process is illustrated as process 432 in the process flow 400 shown in FIG. 24. Metal oxide layer 88 may comprise nitrogen therein, and hence may be a metal oxynitride layer, with metal oxynitride being considered as a type of metal oxide. For example, the portion of the metal oxide layer 88 in gate contact opening 78 may include a metal oxide layer formed from metal layer 82, and a metal oxynitride layer formed from metal nitride layer 84, with the metal oxynitride layer over and contacting the metal oxide layer. On the other hand, the portions of metal nitride layer 84 in source/drain contact opening 76, on the sidewalls of contact openings 76 and 78, and over ILD layer 74 may all be fully converted as metal oxynitride. At the bottom of each of source/drain contact opening 76 and gate contact opening 78, a metal nitride layer 84 remains not oxidized. This is achieved by controlling the oxidation time and temperature.

The oxidation may be performed using an oxygen-containing gas such as oxygen ($O_2$), ozone ($O_3$), or the like. The oxidation may be performed through a thermal process using the aforementioned process gases, with or without plasma being generated. The oxidation may be performed using the plasma generated from the aforementioned process gases, with the temperature of wafer 10 during the oxidation being room temperature or elevated. The temperature of wafer 10 during the thermal and/or plasma oxidation process may also be in the range between room temperature and about 250° C., in the range between about 160° C. and about 250° C. The flow rate of the oxygen-containing gas may be in the range between about 2,000 sccm and about 6,000 sccm. The oxidation duration may be in the range between about 15 seconds and about 60 seconds. The oxidation is performed without applying bias voltage/power.

In a subsequent process, metal oxide layer 88 is removed through etching. The respective process is illustrated as process 434 in the process flow 400 shown in FIG. 24. In accordance with some embodiments, the etching is performed using a chlorine-based etching gas such as $TaCl_5$, $WCl_5$, $WCl_6$, $MoCl_5$, $NbCl_5$, or the like, or combinations thereof. The etching may be performed through a thermal dry etching process, with the temperature of wafer 10 being in the range between about 300° C. and about 500° C. The etching may be performed with or without plasma. Also, during the etching, no hydrogen ($H_2$) is introduced, and no $NH_3$ is introduced. Otherwise, the process gases may become a precursor for depositing a metal layer, rather than for etching metal oxide layer 88. As a result of the etching, metal oxide layer 88 is fully removed. The etching is self-limiting, with the remaining metal nitride layer 84 acting as the etch stop layer. A thin layer of metal nitride layer 84 is thus left at the bottom of each of source/drain contact opening 76 and gate contact opening 78. The remaining metal nitride layer 84 may have a thickness T5 in the range between about 1 nm and about 3 nm. Metal nitride layers 84 may also be as thin as possible, providing they have a full coverage of the bottoms of source/drain contact opening 76 and gate contact opening 78.

Figure 18:
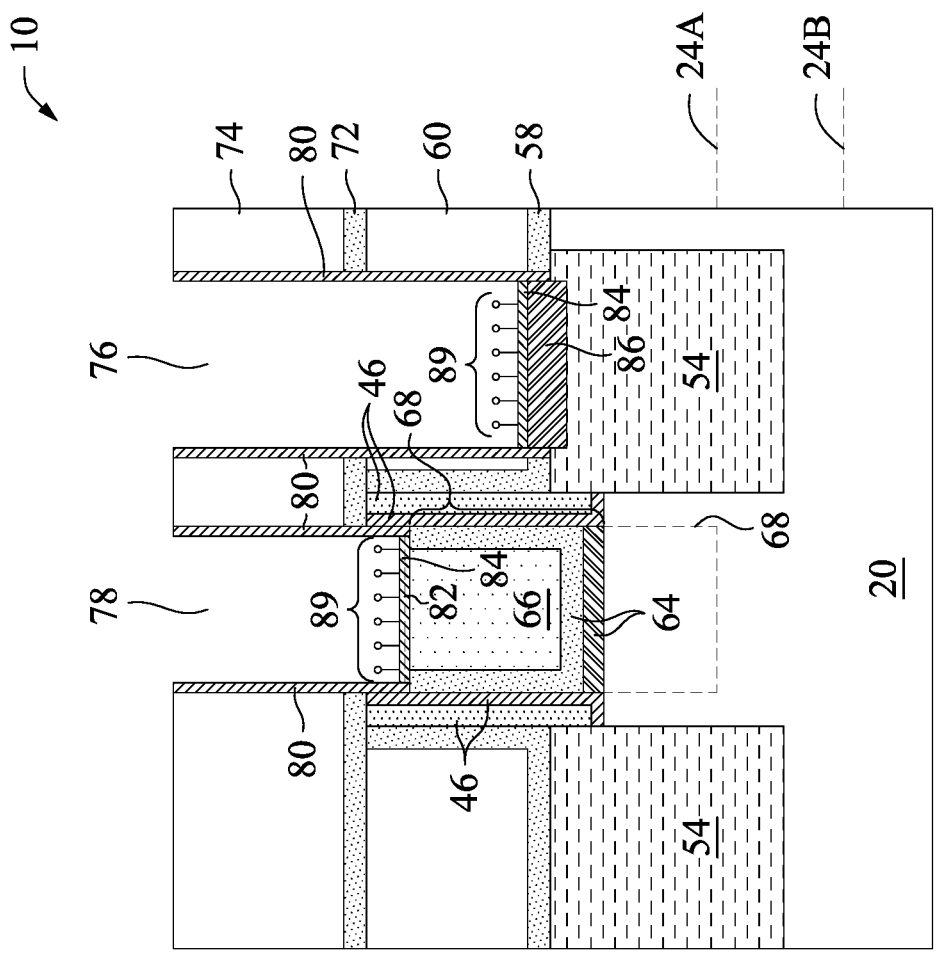

FIG. 18 illustrates a treatment process performed on metal nitride layer 84. The respective process is illustrated as process 436 in the process flow 400 shown in FIG. 24. The treatment may be performed using a process gas, with wafer 10 soaked in the process gas. The process gas may include $TaCl_5$, $NiCl_4$, $WCl_5$, $MoCl_5$, or the like, or combinations thereof. During the treatment, wafer 10 is heated, for example, to a temperature in the range between about 200° C. and about 500° C. No plasma is generated. The treatment duration may be greater than about 5 seconds, and may be in the range between about 5 seconds and 50 seconds. When $TiCl_4$ is used as the treatment process gas, the $TiCl_4$ soaking results in the resulting molecules (such as $TiCl_3$ molecules) to be connected to the dangling bonds of the underlying metal nitride layers 84. The connected molecules are represented as 89, as shown in FIG. 18. On the other hand, no molecules of the treatment gas are connected to the surfaces of the exposed dielectric materials such as dielectric spacers 80 and dielectric layer 74.

Figure 19:
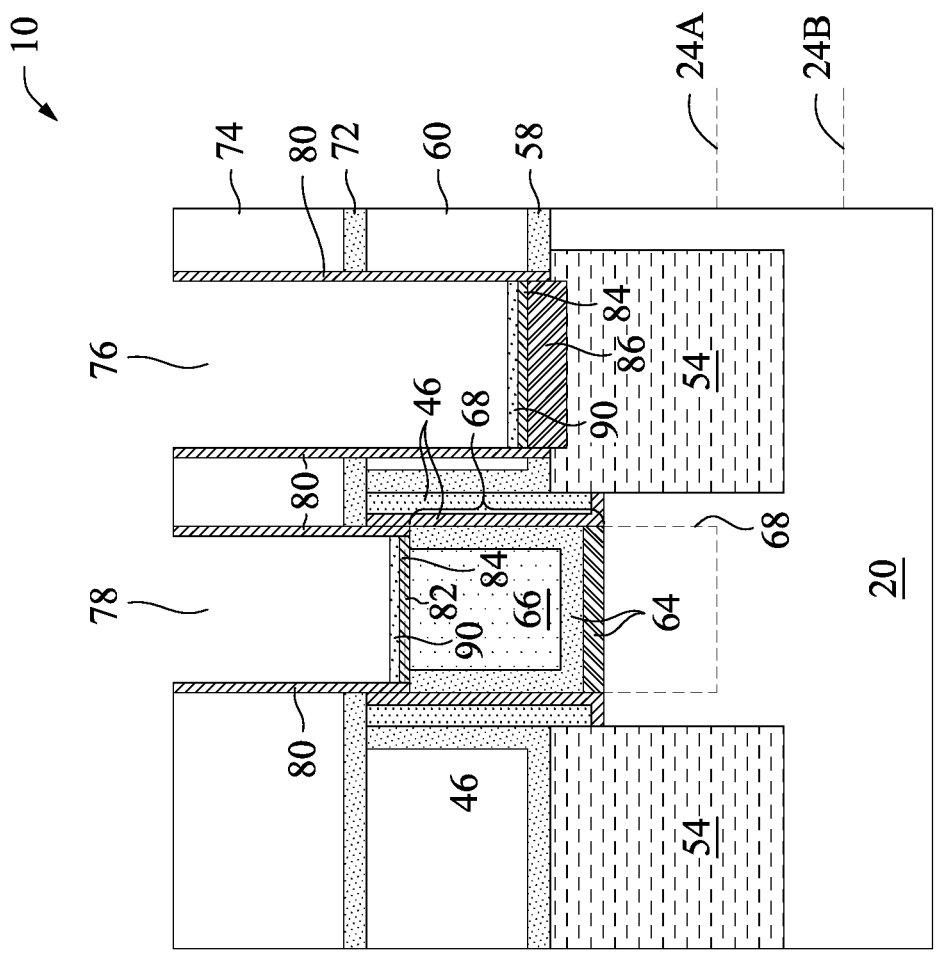

FIG. 19 further illustrates the selective deposition of silicon layer 90 using a silicon-containing gas as a precursor, which may be $SiH_4$, $Si_2H_6$, $Si_3H_8$, or the like, or combinations thereof. The respective process is illustrated as process 438 in the process flow 400 shown in FIG. 24. The deposition may be performed using Chemical Vapor Deposition (CVD) or other applicable methods. During the deposition of silicon layer 90, wafer 10 may be heated, for example, to a temperature in the range between about 400° C. and about 550° C. The pressure of the precursor may be in the range between about 15 torr and about 40 torr. The deposition time may be in the range between about 30 seconds and about 600 seconds. Silicon layer 90 may have a thickness in the range between about 1 Å and about 10 Å, or in the range between about 1 Å and about 5 Å. Silicon layer 90 may be an amorphous layer.

With silicon layer 90 being formed, and with hydrogen being provided (from $SiH_4$, for example), Si—H bonds are formed on the top surface of silicon layers 90. This provides a good base for the subsequent filling of metal, and silicon layer 90 acts as a seed layer for the selective deposition of metal in source/drain contact opening 76 and gate contact opening 78. In accordance with alternative embodiments, the chlorine-based gas treatment and/or the deposition of silicon layer 90 are not performed. In accordance with some embodiments, even if these processes are not performed, with an appropriate process gas being selected, some bottom-up effect may still be achieved by using the metal nitride layers 84 as bases for selective deposition. The selectivity of the deposition, however, is higher when silicon layer 90 is formed, wherein the selectivity is the ratio of the deposition rate of metal on silicon to the deposition rate of metal on dielectric materials.

Figure 20:
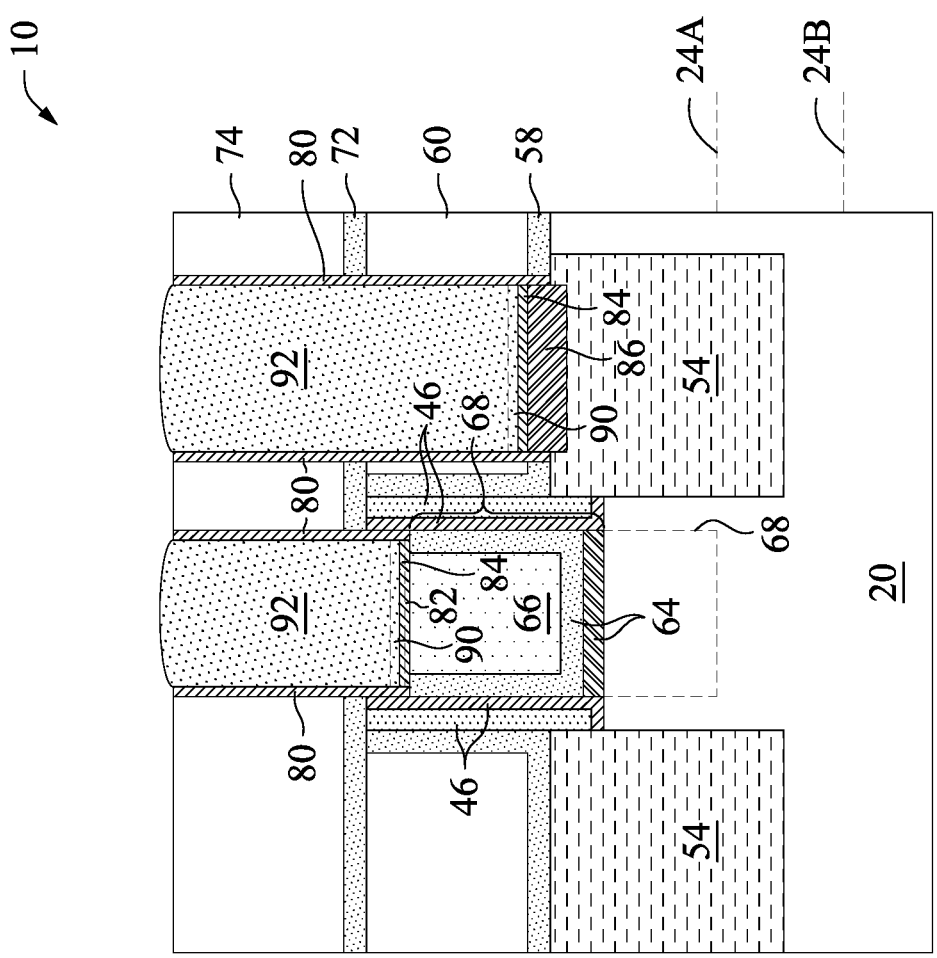

FIG. 20 illustrates the selective bottom-up deposition of a metal into source/drain contact opening 76 and gate contact opening 78, so that metal regions 92 are formed. The respective process is illustrated as process 440 in the process flow 400 shown in FIG. 24. In accordance with some embodiments, metal regions 92 are formed of or comprise aluminum, molybdenum, ruthenium, iridium, tungsten, cobalt, or the like, or combinations thereof. The entireties of metal regions 92 may be homogenous. In accordance with some embodiments in which aluminum is deposited, the reaction process gases include dimethylaluminum hydride (DMAH) and hydrogen ($H_2$). The DMAH tends to deposit aluminum selectively, especially on silicon layer. The deposition method may include CVD or the like methods. The deposition temperature may be in the range between about 175° C. and about 275° C. The pressure of the reaction gases may be in the range between about 1 torr and about 3 torr. The resulting metal regions 92 may fully fill source/drain contact opening 76 and gate contact opening 78, or may be filled to have top surfaces slightly lower than the top surface of ILD 74. For example, the height of metal regions 92 may be in the range between about 500 Å and about 1,500 Å, depending on the depths of source/drain contact opening 76 and gate contact opening 78.

Silicon layer 90 acts as a seed layer for the deposition of metal region 92. On the other hand, metal is not deposited on exposed dielectric materials such as on the surfaces of dielectric spacers 80 and ILD 74. Accordingly, the deposition of metal region 92 is a selective deposition process, and is a bottom-up deposition process. The resulting metal regions 92 are seam-free. Since aluminum has good adhesion to metal nitride layer 84, dielectric spacers 80, and ILD 74, metal regions 92 may be formed without the need of forming adhesion layers (barriers) (typically formed of Ti, TiN, Ta, TaN, or the like). The resulting contact plugs are thus barrier-less.

Figure 23:
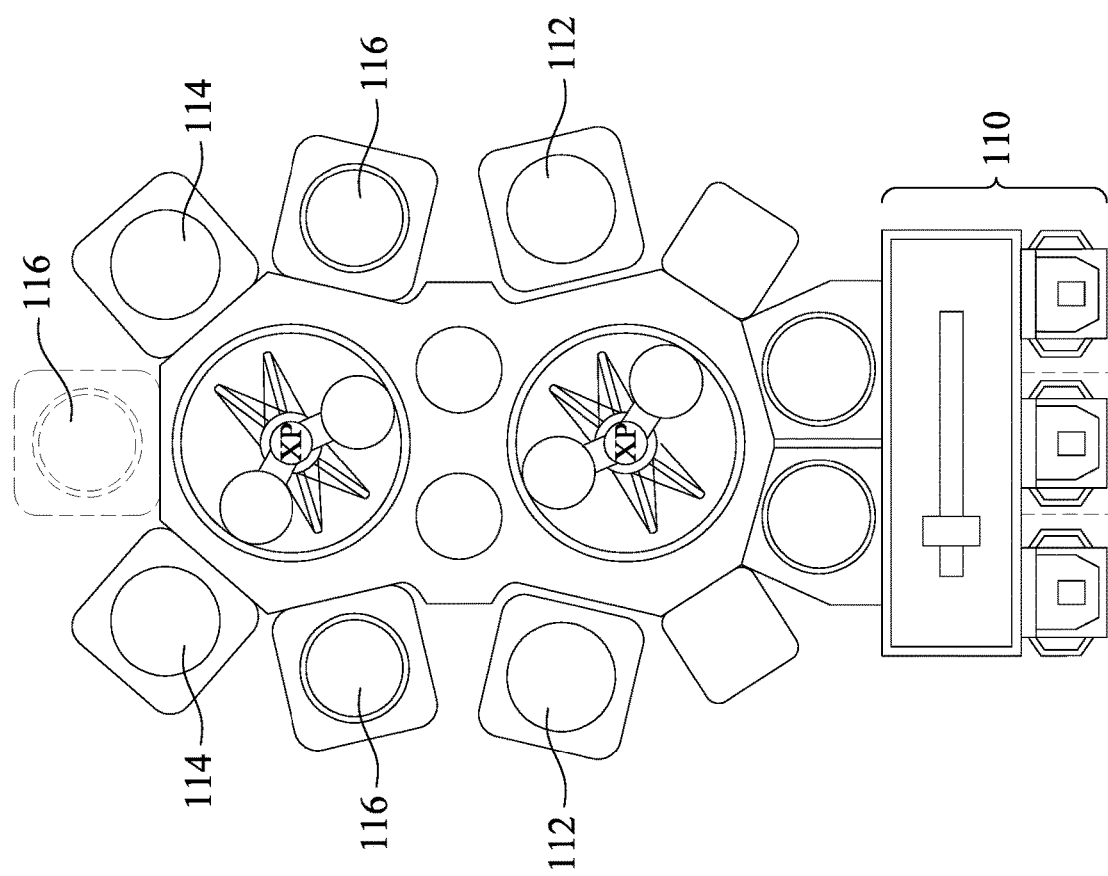
FIG. 23 illustrates a production tool for forming contact plugs in accordance with some embodiments.

FIG. 23 illustrates a production tool 200 for performing the processes as shown in FIGS. 18, 19, and 20. Production tool 200 includes loading module 110 for loading and unloading wafers, and a plurality of process chambers. The process chambers include chambers 112 for the etching of metal oxide (oxynitride) layer 88 (shown in FIG. 17), chambers 114 for treating the metal nitride layers and depositing silicon layers 90 (FIG. 19), and chambers 116 for depositing metal region 92 (FIG. 20). The etching of metal oxide layers, the treating of metal nitride layer 84 and depositing silicon layer 90, and the deposition of metal region 92 are in-situ performed in production tool 200, so that no vacuum break occurs between these processes. Otherwise, the exposed surfaces of metal nitride layers 84 and silicon layers 90 may be oxidized, and the subsequent deposition processes may not be selective.

In a subsequent process, the structure as shown in FIG. 20 goes through a thermal process to reflow metal regions 92. During the reflow process, hydrogen ($H_2$) may be used as a process gas, so that some undesirable impurities such as carbon in metal regions 92 are removed. In the reflow, the temperature of wafer 10 in the thermal process may be in the range between about 400° C. and about 450° C. Aluminum, if used, in metal regions 92 may be molten partially. As a result of the reflow, metal regions 92 have a polycrystalline structure, and the grain size may be advantageously increased than before the reflow. For example, before the reflow process, over 75 percent (grain count percentage) of the grains in metal regions have grain size in the range between about 2 nm and about 8 nm. After the reflow process, over 75 percent of the grains have grain sizes falling into the range between about 9 nm and about 15 nm. Furthermore, with the reflow, seams or voids in metal region 92, if any, are removed.

Depending on the whether the reflow process is performed or not, and depending on the temperature of the subsequent processes, silicon layers 90 may (or may not) react with the overlying metal regions 92 to form metal silicide regions 91, which may be aluminum silicide ($AlSi_y$) regions in accordance with some embodiments. Accordingly, the corresponding region is marked and referred to as silicon-containing regions 90/91 to indicate that there may be distinguishable silicon layers 90, or there may be metal silicide regions 91. In accordance with some embodiments, the thickness of metal silicide regions 91 is in the range between about 2 Å and about 30 Å.

Figure 21:
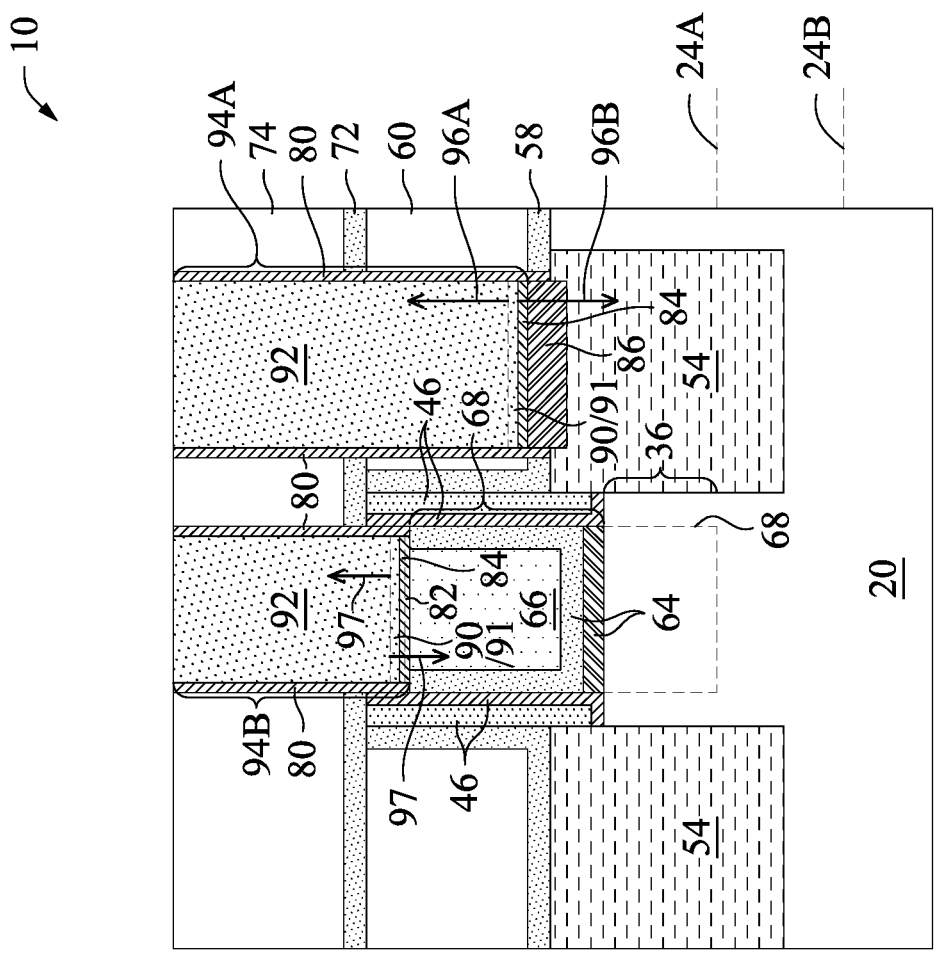

Referring to FIG. 21, a planarization process such as a Chemical Mechanical Polish (CMP) process or a mechanical grinding process is performed to remove excess portions of metal regions 92, so that the top surfaces of metal regions 92 are coplanar with the top surface of ILD 74. The respective process is illustrated as process 442 in the process flow 400 shown in FIG. 24. Source/drain contact plug 94A and gate contact plug 94B are thus formed.

In accordance with some embodiments, source/drain contact plug 94A includes metal region 92, silicon layer 90 or silicide region 91, and metal nitride layer 84. Metal nitride layer 84 overlies and contacts silicide region 86. The elements (such as Ti and Cl) introduced by the treatment (using $TiCl_4$) may be at the interface between silicon layer 90 and metal nitride layer 84. Also, the silicon layer 90 or silicide region 91 may be a distinguishable layer, or may not be a distinguishable layer since it is too thin, and further because the subsequent thermal process may cause its diffusion. The silicon atomic percentage in silicon-containing regions 90/91 may be the highest, and the atomic percentages reduce in the direction farther away from silicon-containing regions 90/91. Similarly, some elements such as chlorine may be observed in silicon-containing regions 90/91 (due to the $TiCl_4$ treatment), the concentrations of these elements may reduce farther away from the interface regions. For example, arrows 96A and 96B in FIG. 21 illustrate the directions in which chlorine percentages may decrease gradually. Arrow 96A also illustrates the direction in which silicon atomic percentage reduce. It is noted, however, that the silicon atomic percentage in silicide region 86 may reach a peak. Accordingly, silicon atomic percentage may present two concentration peaks, with the first peak in silicide region 86, and the second peak being where silicon layer 90 is. The second peak may be lower than the first peak. The silicon atomic percentage in metal nitride layer 84 may be lower than in both peaks.

In accordance with some embodiments, gate contact plug 94B includes metal region 94, silicon-containing region 90/91, and metal nitride layer 84. Titanium layer 82 may or may not exist. Accordingly, either the bottom surface of metal nitride layer 84 or the bottom surface of titanium layer 82 contacts gate electrode 66. The elements (such as Ti and Cl) introduced by the treatment (using $TiCl_4$) may be at the interface between silicon-containing region 90/91 and metal nitride layer 84. Also, the silicon-containing region 90/91 may be a distinguishable layer, or may not be a distinguishable layer since it is too thin, and further because the subsequent thermal process may cause its diffusion. The silicon atomic percentage in silicon-containing region 90/91 may be the highest, and the atomic percentages reduce in the direction farther away from silicon-containing region 90/91. Similarly, some elements such as chlorine may be observed at the interface regions, and the concentrations of these elements may reduce farther away from the interface regions. For example, arrows 97 in FIG. 21 illustrate the directions in which silicon atomic percentages and chlorine percentages may decrease gradually.

Figure 22:
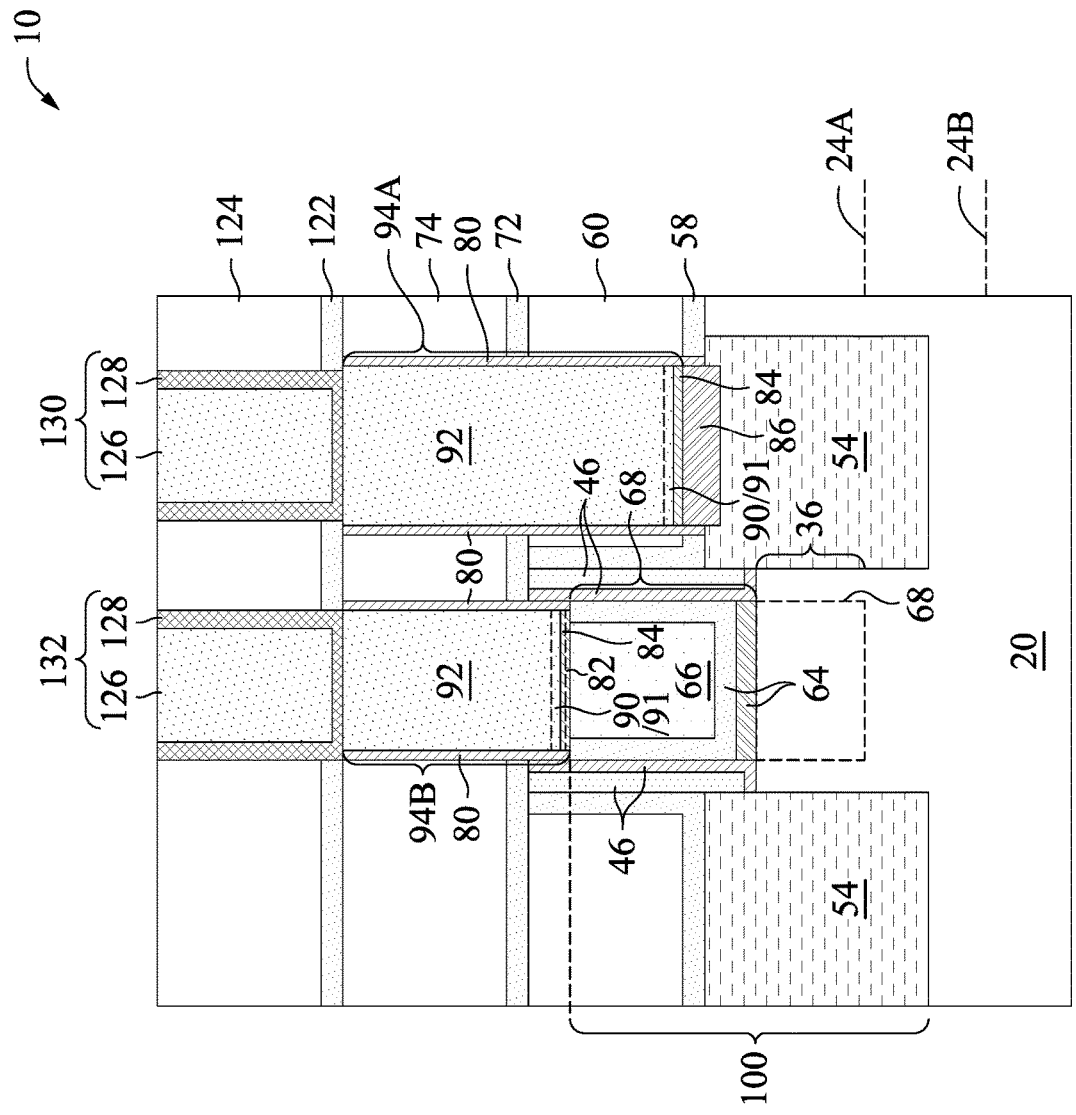

FIG. 22 illustrates the formation of etch stop layer 122 and dielectric layer 124. In accordance with some embodiments, etch stop layer 122 is formed of or comprise silicon carbide, silicon oxy-carbide, silicon oxy-nitride, aluminum oxide, or the like, or multi-layers thereof. Dielectric layer 124 may be a low-k dielectric layer. Vias 130 and 132 are formed to extend into dielectric layer 124 and etch stop layer 122, and to contact source/drain contact plug 94A and gate contact plug 94B, respectively. Each of vias 130 and 132 may include adhesion/barrier layer 126 and filling metal region 128. Adhesion/barrier layer 126 may be formed of Ti, TiN, Ta, TaN, or the like. Filling metal region 128 may comprise Ru, Ir, Mo, W, Cu, or the like, or alloys thereof.

The embodiments of the present disclosure have some advantageous features. By oxidizing metal nitride layers, the metal nitride layers may be removed from sidewalls and top surfaces of dielectric layers, while metal nitride layers may be selectively left at the bottoms of contact openings. This enables the selective deposition of silicon layers, and hence the selective bottom-up deposition of metal regions. Accordingly, the contact plugs are seam free.

In accordance with some embodiments of the present disclosure, a method includes etching a dielectric layer to form a trench in the dielectric layer; depositing a metal layer extending into the trench; performing a nitridation process on the metal layer to convert an upper portion of the metal layer into a metal nitride layer; performing an oxidation process on the metal nitride layer to form a metal oxynitride layer; removing the metal oxynitride layer; and filling a metallic material into the trench using a bottom-up deposition process to form a contact plug. In an embodiment, a source/drain region under the dielectric layer is revealed after the trench is formed. In an embodiment, the method further comprises, after the nitridation process and before the oxidation process, performing an annealing process to react a lower portion of the metal layer with the source/drain region to form a silicide region. In an embodiment, after the metal oxynitride layer is removed, a bottom portion of the metal nitride layer remains at a bottom of the trench. In an embodiment, the method further comprises selectively depositing a silicon layer on the bottom portion of the metal nitride layer, wherein the metallic material is selectively grown from the silicon layer. In an embodiment, the method further comprises, before the selectively depositing the silicon layer, treating the bottom portion of the metal nitride layer using titanium chloride ($TiCl_4$). In an embodiment, the oxidation process performed on the metal nitride layer results in all of the metal nitride layer over the dielectric layer and all of the metal nitride layer on sidewalls of the dielectric layer to be oxidized, with a bottom portion of the metal nitride layer at a bottom of the trench remaining after the oxidation process. In an embodiment, the removing the metal oxynitride layer and the filling the metallic material are in-situ performed in a same vacuum environment.

In accordance with some embodiments of the present disclosure, a device includes a contact etch stop layer; a first inter-layer dielectric over the contact etch stop layer; and a contact plug extending into the contact etch stop layer and the first inter-layer dielectric, the contact plug comprising: a metal nitride layer; a silicon-containing layer over the metal nitride layer; and a homogeneous metallic material over the silicon-containing layer. In an embodiment, the metal nitride layer comprises a first metal, and the homogeneous metallic material comprises a second metal different from the first metal. In an embodiment, the silicon-containing layer comprises aluminum silicide. In an embodiment, the device further comprises chlorine at an interface between the silicon-containing layer and the metal nitride layer. In an embodiment, the device further comprises a silicide region underlying the metal nitride layer, wherein first chlorine atomic concentrations in the silicon-containing layer and the metal nitride layer are higher than second chlorine atomic concentrations in the homogeneous metallic material and the silicide region. In an embodiment, the metal nitride layer does not extend on sidewalls of the homogeneous metallic material. In an embodiment, sidewalls of the homogeneous metallic material are in contact with sidewalls of the first inter-layer dielectric. In an embodiment, the device further comprises an etch stop layer over the first inter-layer dielectric; and a second inter-layer dielectric over the etch stop layer, wherein the contact plug further extends into the etch stop layer and the second inter-layer dielectric. In an embodiment, the device further comprises a metal layer under the metal nitride layer; and a gate electrode underlying and contacting the metal layer.

In accordance with some embodiments of the present disclosure, a device includes a source/drain region; a first metal silicide region over and contacting the source/drain region; a contact plug over and contacting the first metal silicide region, the contact plug comprising: a metal nitride layer; a second metal silicide region over the metal nitride layer; and an aluminum region over the second metal silicide region. In an embodiment, the contact plug is barrier-less. In an embodiment, the device further comprises a contact etch stop layer; an inter-layer dielectric over the contact etch stop layer; and a dielectric spacer encircling and contacting the contact plug, wherein the dielectric spacer extends into both of the contact etch stop layer and the inter-layer dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a dielectric layer to form a trench in the dielectric layer;
   depositing a metal layer extending into the trench;
   performing a nitridation process on the metal layer to convert an upper portion of the metal layer into a metal nitride layer;
   performing an oxidation process on the metal nitride layer to form a metal oxynitride layer;
   removing the metal oxynitride layer, wherein after the metal oxynitride layer is removed, a bottom portion of the metal nitride layer remains at a bottom of the trench;
   selectively depositing a silicon layer on the bottom portion of the metal nitride layer; and
   filling a metallic material into the trench using a bottom-up deposition process to form a contact plug, wherein the metallic material is selectively grown from the silicon layer using the silicon layer as a seed layer.

2. The method of claim 1, wherein a source/drain region under the dielectric layer is revealed after the trench is formed.

3. The method of claim 2 further comprising, after the nitridation process and before the oxidation process, performing an annealing process to react a lower portion of the metal layer with the source/drain region to form a silicide region.

4. The method of claim 1 further comprising, before the selectively depositing the silicon layer, treating the bottom portion of the metal nitride layer using titanium chloride ($TiCl_4$).

5. The method of claim 1, wherein the oxidation process performed on the metal nitride layer results in all of the metal nitride layer over the dielectric layer and all of the metal nitride layer on sidewalls of the dielectric layer to be oxidized, with the bottom portion of the metal nitride layer at the bottom of the trench remaining after the oxidation process.

6. The method of claim 1, wherein the removing the metal oxynitride layer and the filling the metallic material are in-situ performed in a same vacuum environment.

7. A method comprising:
depositing a metal layer extending into a trench in a dielectric layer, wherein the metal layer comprises:
a first bottom portion over and contacting a source/drain region; and
first sidewall portions in the trench and on sidewalls of the dielectric layer;
performing a nitridation process, wherein the first sidewall portions of the metal layer and a surface portion of the first bottom portion of the metal layer are nitridated to form a second bottom portion and second sidewall portions of a metal nitride layer;
performing an annealing process to form a silicide region over the source/drain region;
removing the second sidewall portions of the metal nitride layer, wherein a bottom portion of the metal nitride layer at a bottom of the trench remains;
depositing a silicon layer on the portion of the metal nitride layer at the bottom of the trench; and
filling a metallic material into the trench to form a contact plug.

8. The method of claim 7, wherein the metallic material is filled through a bottom-up deposition process.

9. The method of claim 8, wherein the bottom-up deposition process comprises selectively depositing the metallic material from the silicon layer.

10. The method of claim 9 further comprising, before the silicon layer is deposited, pre-treating the remaining bottom portion of the metal nitride layer using titanium chloride ($TiCl_4$).

11. The method of claim 7, wherein the removing the second sidewall portions of the metal nitride layer comprises:
performing an oxidation process on the metal nitride layer to form a metal oxynitride layer; and
removing the metal oxynitride layer.

12. The method of claim 11, wherein the removing the metal oxynitride layer and the filling the metallic material are in-situ performed without vacuum break therein.

13. The method of claim 7, wherein the filling the metallic material comprises selectively growing aluminum.

14. The method of claim 13, wherein the metallic material is selectively grown using dimethyl aluminum hydride (DMAH) and hydrogen ($H_2$).

15. A method comprising:
depositing a metal layer extending into a trench of a dielectric layer, wherein a first portion of the metal layer at a bottom of the trench has a first thickness, and a second portion of the metal layer in the trench and on a sidewall of the dielectric layer has a second thickness smaller than the first thickness;
performing a nitridation process on the metal layer to form a metal nitridation layer;
performing an oxidation process on the metal nitride layer to form a metal oxynitride layer, wherein the oxidation process performed on the metal nitride layer results in all of the metal nitride layer over the dielectric layer and all of the metal nitride layer on sidewalls of the dielectric layer to be oxidized, with a bottom portion of the metal nitride layer at a bottom of the trench remaining after the oxidation process;
removing the metal oxynitride layer; and
depositing a metallic material to fill the trench.

16. The method of claim 15 further comprising selectively depositing a silicon layer on the bottom portion of the metal nitride layer.

17. The method of claim 16, wherein the metallic material is selectively grown from the silicon layer through a bottom-up deposition process, wherein the silicon layer is used as a seed layer in the bottom-up deposition process.

18. The method of claim 16, wherein the oxidation process is performed with plasma.

19. The method of claim 1, wherein the removing the metal nitride layer is performed using a chlorine-base gas.

20. The method of claim 19, wherein in the removing the metal nitride layer, gases used for the removing are free from ammonia.

* * * * *